United States Patent
Yamazaki et al.

(10) Patent No.: US 8,772,627 B2
(45) Date of Patent: Jul. 8, 2014

(54) PHOTOELECTRIC CONVERSION DEVICE AND MANUFACTURING METHOD THEREOF

(75) Inventors: Shunpei Yamazaki, Tokyo (JP);
Yasuyuki Arai, Kanagawa (JP);
Satohiro Okamoto, shizuoka (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 296 days.

(21) Appl. No.: 12/848,357

(22) Filed: Aug. 2, 2010

(65) Prior Publication Data

US 2011/0030783 A1 Feb. 10, 2011

(30) Foreign Application Priority Data

Aug. 7, 2009 (JP) ................. 2009-184794

(51) Int. Cl.
*H01L 31/00* (2006.01)
*H01L 31/0352* (2006.01)
*H01L 31/0368* (2006.01)

(52) U.S. Cl.
CPC ... *H01L 31/035209* (2013.01); *H01L 31/03682* (2013.01)
USPC ...................................... 136/255

(58) Field of Classification Search
CPC ............... H01L 31/0352; H01L 31/035209; H01L 31/036; H01L 31/03682; H01L 31/0376; H01L 31/03762
USPC ...................................... 136/255
See application file for complete search history.

(56) References Cited

U.S. PATENT DOCUMENTS

| | | | |
|---|---|---|---|
| 5,594,569 | A | 1/1997 | Konuma et al. |
| 5,700,333 | A | 12/1997 | Yamazaki et al. |
| 5,810,945 | A | 9/1998 | Stutzmann et al. |
| 6,056,614 | A | 5/2000 | Adachi |
| 6,140,667 | A | 10/2000 | Yamazaki et al. |
| 6,344,420 | B1 | 2/2002 | Miyajima et al. |
| 6,365,933 | B1 | 4/2002 | Yamazaki et al. |
| 6,599,788 | B1 | 7/2003 | Kawasaki et al. |
| 6,787,806 | B1 | 9/2004 | Yamazaki et al. |
| 6,809,023 | B2 | 10/2004 | Arai et al. |
| 7,679,131 | B1 | 3/2010 | Kawasaki et al. |
| 7,695,985 | B2 | 4/2010 | Tanaka et al. |

(Continued)

FOREIGN PATENT DOCUMENTS

| | | | |
|---|---|---|---|
| JP | 61084073 A | * | 4/1986 |
| JP | 08-509839 | | 10/1996 |

(Continued)

*Primary Examiner* — Eli Mekhlin
(74) *Attorney, Agent, or Firm* — Eric J. Robinson; Robinson Intellectual Property Law Office, P.C.

(57) ABSTRACT

To provide a photoelectric conversion device whose characteristics are sufficiently improved. The photoelectric conversion device includes: a first electrode; a unit cell having a semiconductor layer exhibiting a first conductivity type, a semiconductor layer having an effect of photoelectric conversion, and a semiconductor layer exhibiting a second conductivity type; and a second electrode. In the semiconductor layer having an effect of photoelectric conversion, crystal grains each grain diameter of which is smaller than a thickness of the semiconductor layer having an effect of photoelectric conversion are aligned in the thickness direction of the semiconductor layer having an effect of photoelectric conversion from the semiconductor layer exhibiting the first conductivity type to the semiconductor layer exhibiting the second conductivity type.

36 Claims, 14 Drawing Sheets

(56) References Cited

U.S. PATENT DOCUMENTS

| | | |
|---|---|---|
| 7,709,309 B2 | 5/2010 | Moriwaka |
| 7,972,943 B2 | 7/2011 | Moriwaka |
| 8,049,215 B2 | 11/2011 | Jinbo et al. |
| 8,278,739 B2 | 10/2012 | Moriwaka |
| 8,304,775 B2 | 11/2012 | Miyairi et al. |
| 8,349,714 B2 | 1/2013 | Tanaka et al. |
| 2004/0149330 A1* | 8/2004 | Sugiyama et al. ............. 136/249 |
| 2007/0175507 A1* | 8/2007 | Dutta ............................. 136/255 |
| 2008/0230782 A1* | 9/2008 | Antoniadis et al. ............. 257/53 |
| 2009/0321737 A1 | 12/2009 | Isa et al. |
| 2010/0043874 A1 | 2/2010 | Liu |
| 2010/0051949 A1 | 3/2010 | Yamazaki et al. |
| 2010/0224244 A1* | 9/2010 | Furusawa ....................... 136/256 |
| 2010/0275989 A1 | 11/2010 | Fujii et al. |
| 2010/0307558 A1 | 12/2010 | Yamazaki et al. |
| 2010/0307559 A1 | 12/2010 | Yamazaki et al. |
| 2010/0307590 A1 | 12/2010 | Yamazaki et al. |

FOREIGN PATENT DOCUMENTS

| | | | |
|---|---|---|---|
| JP | 2000-269201 | | 9/2000 |
| JP | 2004-200345 | | 7/2004 |
| JP | 2006-114815 | | 4/2006 |
| JP | 2006-237490 | | 9/2006 |
| JP | 2009-021585 | | 1/2009 |
| JP | 2009-026887 A | | 2/2009 |
| JP | 2009170506 A | * | 7/2009 |
| JP | 2010-067801 A | | 3/2010 |

\* cited by examiner

PHOTOELECTRIC CONVERSION DEVICE AND MANUFACTURING METHOD THEREOF

BACKGROUND OF THE INVENTION

1. Field of the Invention

The disclosed invention relates to a photoelectric conversion device using a photovoltaic effect of a semiconductor. The disclosed invention includes a photoelectric conversion device in which a support substrate is provided with a semiconductor layer.

2. Description of the Related Art

To deal with global environmental issues in recent years, the market for photoelectric conversion devices typified by residential photovoltaic systems and the like has expanded. Bulk photoelectric conversion devices including single crystal silicon or polycrystalline silicon, which have high conversion efficiency, have already been put into practical use.

The photoelectric conversion devices including single crystal or polycrystalline silicon are manufactured by being cut out of large silicon ingots. However, since it takes a long time to manufacture large silicon ingots, the productivity is low. Accordingly, the supply of silicon ingots is insufficient and cannot respond to the expansion of the market.

As the shortage of raw materials of solar cells becomes obvious, thin-film photoelectric conversion devices including an amorphous silicon thin film or a microcrystalline silicon thin film have attracted attention. In the thin-film photoelectric conversion devices, silicon thin films are formed over support substrates by a variety of chemical or physical growth methods. Therefore, it is said that the thin-film photoelectric conversion devices enable resource saving and cost reduction as compared with the bulk photoelectric conversion devices.

As an example of a thin-film photoelectric conversion element, an element that is provided with a protuberance which sticks out of an interface side of an electrode into a light absorption layer has been proposed (see Patent Document 1). The protuberance which sticks out into the light absorption layer is provided to serve as a path of photogenerated carriers, which improves the collection efficiency and prevents light degradation.

REFERENCE

Patent Document

[Patent Document 1] Japanese Translation of PCT International Application No. H8-509839

SUMMARY OF THE INVENTION

However, according to the above-mentioned technique, in addition to deposition of thin films, complicated treatment such as irradiation using a laser beam interference pattern and etching is needed in order to form a carrier path. Further, a carrier path which exists continuously from a p-type semiconductor layer to an n-type semiconductor layer cannot be formed in a semiconductor layer having an effect of photoelectric conversion. Thus, the carrier path cannot achieve an effect enough, so that the characteristics of a photoelectric conversion device (a solar cell) cannot be improved sufficiently.

One object of the disclosed invention in this specification is to provide a photoelectric conversion device in which the above-mentioned problems are solved and the characteristics are sufficiently improved. Another object is to provide a method for manufacturing the photoelectric conversion device.

One embodiment of the disclosed invention is a photoelectric conversion device including a carrier path which exists continuously from a p-type semiconductor layer to an n-type semiconductor layer in a semiconductor layer having an effect of photoelectric conversion, and one embodiment of the disclosed invention is a method for forming such a photoelectric conversion device.

More specific description is given below.

One embodiment of the disclosed invention is a photoelectric conversion device including: a first electrode; a unit cell having a semiconductor layer exhibiting a first conductivity type, a semiconductor layer having an effect of photoelectric conversion, and a semiconductor layer exhibiting a second conductivity type; and a second electrode. In the semiconductor layer having an effect of photoelectric conversion, crystal grains each grain diameter of which is smaller than a thickness of the semiconductor layer having an effect of photoelectric conversion are aligned in the thickness direction of the semiconductor layer having an effect of photoelectric conversion from the semiconductor layer exhibiting the first conductivity type to the semiconductor layer exhibiting the second conductivity type.

One embodiment of the disclosed invention is a photoelectric conversion device including: a first electrode; a plurality of unit cells each having a semiconductor layer exhibiting a first conductivity type, a semiconductor layer having an effect of photoelectric conversion, and a semiconductor layer exhibiting a second conductivity type; and a second electrode. In the semiconductor layer having an effect of photoelectric conversion in one of the unit cells, crystal grains each grain diameter of which is smaller than a thickness of the semiconductor layer having an effect of photoelectric conversion are aligned in the thickness direction of the semiconductor layer having an effect of photoelectric conversion from the semiconductor layer exhibiting the first conductivity type to the semiconductor layer exhibiting the second conductivity type.

The above-mentioned photoelectric conversion devices include a plurality of regions in which the crystal grains are aligned in some cases. There are some cases where the regions in which the crystal grains are aligned are localized. There are also some cases where a base of the semiconductor layer having an effect of photoelectric conversion is formed using an amorphous semiconductor. The base of the semiconductor layer having an effect of photoelectric conversion refers to a portion of the semiconductor layer except the crystal grains.

One embodiment of the disclosed invention is a method for manufacturing a photoelectric conversion device, including the steps of: forming a first electrode; forming over the first electrode a unit cell including a semiconductor layer exhibiting a first conductivity type, a semiconductor layer having an effect of photoelectric conversion over the semiconductor layer exhibiting the first conductivity type, and a semiconductor layer exhibiting a second conductivity type over the semiconductor layer having an effect of photoelectric conversion; and forming a second electrode over the unit cell. The semiconductor layer having an effect of photoelectric conversion is formed to include a region in which crystal grains are aligned in the thickness direction of the semiconductor layer having an effect of photoelectric conversion, and a grain diameter of the crystal grain is smaller than a thickness of the semiconductor layer having an effect of photoelectric conversion.

One embodiment of the disclosed invention is a method for manufacturing a photoelectric conversion device, including the steps of: forming a first electrode; forming over the first electrode a plurality of unit cells each having a semiconductor layer exhibiting a first conductivity type, a semiconductor layer having an effect of photoelectric conversion, and a semiconductor layer exhibiting the second conductivity type; and forming a second electrode over the plurality of unit cells. In one of the plurality of unit cells, the semiconductor layer having an effect of photoelectric conversion is formed to include a region in which crystal grains are aligned in the thickness direction of the semiconductor layer having an effect of photoelectric conversion, and a grain diameter of the crystal grain is smaller than a thickness of the semiconductor layer.

In the above-mentioned method, the semiconductor layer having an effect of photoelectric conversion in which the crystal grains are linearly arranged in the thickness direction is formed by a plasma CVD method using glow discharge plasma in some cases. There are some cases where the glow discharge plasma is generated so that a localized high density region is formed. There are also some cases where the semiconductor layer having an effect of photoelectric conversion in which the crystal grains are linearly arranged in the thickness direction is formed by deposition of crystal grains which are formed in the localized high density region.

It is preferable that a crystal grain which grows in a vapor phase to have a grain diameter of several nanometers adhere to a deposition surface so that the crystal grain is included in the semiconductor layer.

In this specification, a "single crystal" refers to a crystal which has aligned crystal faces or aligned crystal axes and in which atoms or molecules constituting the crystal are arranged in a spatially regular manner. However, although single crystals are structured by orderly aligned atoms, single crystals may include disorder such as a lattice defect in which the alignment is partly disordered, or intended or unintended lattice distortion.

In this specification, numerals such as "first", "second", and "third" are given for convenience in order to distinguish elements, and do not limit the number, the arrangement, and the order of steps.

In one embodiment of the disclosed invention, a generation region of photocarriers and a transport region of the photocarriers can be provided due to the crystal grains included in the semiconductor layer having an effect of photoelectric conversion. Accordingly, the collection efficiency is improved, whereby the conversion efficiency of the photoelectric conversion device can be increased.

DETAILED DESCRIPTION OF THE INVENTION

Figure 1:
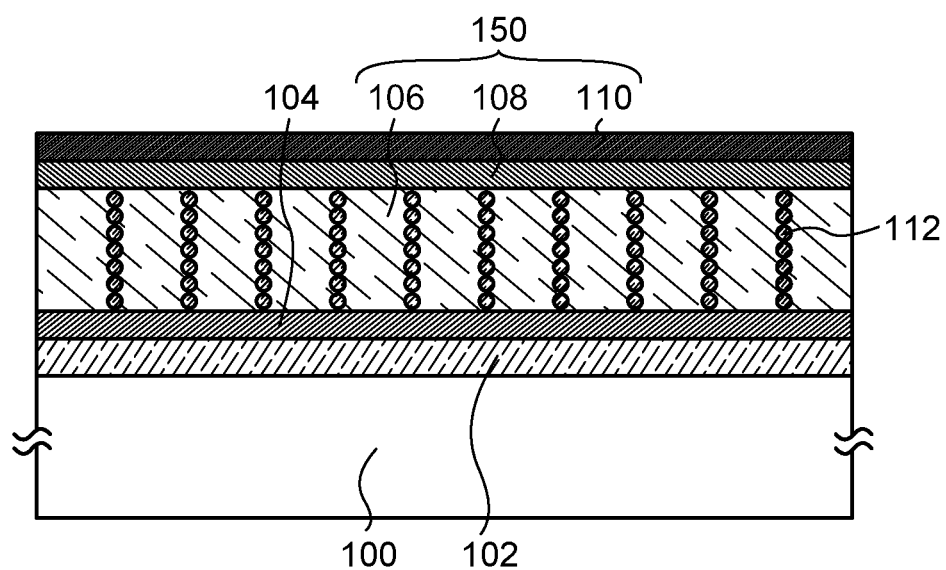
FIG. 1 is a cross-sectional view illustrating one example of a photoelectric conversion device.

Embodiments of the disclosed invention will be described below with reference to accompanying drawings. Note that the disclosed invention is not limited to the description below, and it is easily understood by those skilled in the art that a variety of changes and modifications can be made without departing from the spirit and scope of the disclosed invention. Therefore, the disclosed invention is not to be construed as being limited to the description of the embodiments below.

In the embodiments below, the same parts may be denoted by the same reference numerals throughout the drawings. Note that the thickness, the width, a relative position, and the like of components, that is, layers, regions, and the like illustrated in the drawings are exaggerated in some cases for clarification in the description of the embodiments.

(Embodiment 1)

A photoelectric conversion device according to one embodiment of the disclosed invention includes a structure in which crystal grains are linearly arranged from a semiconductor layer exhibiting a first conductivity type to a semiconductor layer exhibiting a second conductivity type (hereinafter the structure is also referred to as a carrier path) in the semiconductor layer having an effect of photoelectric conversion. Alternatively, in the semiconductor layer having an effect of photoelectric conversion, crystal grains each grain diameter of which is smaller than a thickness of the semiconductor layer having an effect of photoelectric conversion are aligned in the thickness direction of the semiconductor layer having an effect of photoelectric conversion from the semiconductor layer exhibiting the first conductivity type to the semiconductor layer exhibiting the second conductivity type. The carrier path has a higher conductivity than that of the base of the semiconductor layer having an effect of photoelectric conversion (a portion expect the crystal grains in the semiconductor layer). An example of the photoelectric conversion device according to one embodiment of the disclosed invention is described below with reference to FIG. 1.

<Structure of Photoelectric Conversion Device>

A photoelectric conversion device illustrated in FIG. 1 includes a substrate 100, a first electrode 102, a unit cell 150, and a second electrode 110. A semiconductor layer 104 exhibiting a first conductivity type, a semiconductor layer 106 having an effect of photoelectric conversion, and a semiconductor layer 108 exhibiting a second conductivity type are stacked to form the unit cell 150. Crystal grains 112 which form a carrier path exist in the semiconductor layer 106 having an effect of photoelectric conversion. The semiconductor layer 106 having an effect of photoelectric conversion includes a plurality of regions (carrier paths) in which the crystal grains 112 are aligned, and the carrier paths are localized. Note that although light enters from the bottom surface side of the substrate 100 (a lower side in the diagram) in this embodiment, one embodiment of the disclosed invention is not limited thereto, and light may enter from a second electrode 110 side (an upper side in the diagram).

<Substrate>

As the substrate 100, typically, a variety of glass substrates used in the electronics industry, such as substrates of aluminosilicate glass, barium borosilicate glass, or aluminoborosilicate glass can be employed. Alternatively, a quartz substrate, a sapphire substrate, or the like can be used. Further, a substrate including an organic material can be used. As the substrate including an organic material, it is preferable to use a substrate including a thermosetting resin such as an epoxy resin, an unsaturated polyester resin, a polyimide resin, a bismaleimide-triazine resin, or a cyanate resin, or a substrate including a thermoplastic resin such as a polyphenylene oxide resin, a polyetherimide resin, or a fluorine resin.

A texture structure or the like may be provided for a surface of the substrate 100. Accordingly, photoelectric conversion efficiency can be improved.

Note that in this embodiment, a light transitive substrate is used since a structure in which light enters from the bottom surface side of the substrate 100 (the lower side in the diagram) is employed. However, when the structure in which light enters from the second electrode 110 side (an upper side in the diagram) is employed, the substrate is not limited to a light transitive substrate. In such a case, a semiconductor substrate including silicon or the like or a conductive substrate including a metal material may be used.

<First Electrod>

As the first electrode 102, an electrode formed using a conductive material having a light-transmitting property is typically employed. Examples of the conductive material having a light-transmitting property include the following oxides (metal oxides): an In—Sn—Zn—O-based oxide; an In—Al—Zn—O-based oxide; a Sn—Ga—Zn—O-based oxide; an Al—Ga—Zn—O-based oxide; a Sn—Al—Zn—O-based oxide; an In—Zn—O-based oxide; a Sn—Zn—O-based oxide; an Al—Zn—O-based oxide; an In—O-based oxide; a Sn—O-based oxide; and a Zn—O-based oxide. In particular, an indium oxide, an alloy of indium oxide and tin oxide (ITO), a zinc oxide, an alloy of indium oxide and zinc oxide, or the like is preferably used. Alternatively, a Zn—O—Al—N-based material may be used. Further, the conductive material having a light-transmitting property is not limited to an inorganic material and may be an organic material. As the organic material, a material (a conductive high molecular material) including polyaniline, polypyrrole, or polythiophene, or a derivative thereof can be used.

Note that in this embodiment, the first electrode 102 formed using the conductive material having a light-transmitting property is used since a structure in which light enters from the bottom surface side of the substrate 100 (the lower side in the diagram) is employed. However, when the structure in which light enters from the second electrode 110 side (an upper side in the diagram) is employed, the electrode is not limited to an electrode formed using the conductive material having a light-transmitting property. In such a case, a material not having a light-transmitting property such as aluminum, platinum, gold, silver, copper, titanium, tantalum, or tungsten can be used. In particular, when a material that easily reflects light such as aluminum, silver, titanium, or tantalum is used, photoelectric conversion efficiency can be sufficiently improved.

A texture structure or the like may be provided for a surface of the first electrode 102 in a manner similar to the surface of the substrate 100. Further, an auxiliary electrode formed using a low-resistant conductive material may be formed to be in contact with the first electrode 102.

<Semiconductor Layer Exhibiting First Conductivity Type, Semiconductor Layer Exhibiting Second Conductivity Type>

As the semiconductor layer 104 exhibiting the first conductivity type and the semiconductor layer 108 exhibiting the second conductivity type, a semiconductor layer including a semiconductor material to which an impurity element imparting a conductivity type is added is typically employed. As the semiconductor material, silicon is preferably used in view of productivity, cost, and the like. In the case of using silicon as the semiconductor material, phosphorus or arsenic which imparts n-type, boron or aluminum which imparts p-type, or the like is employed as the impurity element imparting a conductivity type. In this embodiment, a case in which silicon is used as the semiconductor material, the first conductivity type is p-type, and the second conductivity type is n-type is described. The photoelectric conversion device according to one embodiment of the disclosed invention is not limited to this case. It is possible that the first conductivity type is n-type and the second conductivity type is p-type.

There are other semiconductor materials which can be used for the semiconductor layer 104 and the semiconductor layer 108, such as silicon carbide, germanium, gallium arsenide, indium phosphide, zinc selenide, gallium nitride, and silicon germanium. Alternatively, a semiconductor material including an organic material, a semiconductor material including a metal oxide, or the like can be used. The material which can be used for the semiconductor layer 104 and the semiconductor layer 108 can be selected as appropriate in consideration of the semiconductor layer 106 having an effect of photoelectric conversion.

There are no particular requirements for crystallinity of the semiconductor layer 104 and crystallinity of the semiconductor layer 108; any of the following can be adopted: an amorphous semiconductor, a microcrystal semiconductor, a polycrystal semiconductor, and a single crystal semiconductor.

Note that a texture structure or the like may be provided for a surface of the semiconductor layer 104 and a surface of the semiconductor layer 108 in a manner similar to the surface of the substrate 100.

<Semiconductor Layer having Effect of Photoelectric Conversion>

For the semiconductor layer 106 having an effect of photoelectric conversion, the semiconductor material which is the same as that of the semiconductor layer 104 and the semiconductor layer 108 is used. That is, as the semiconductor material, silicon, silicon carbide, germanium, gallium arsenide, indium phosphide, zinc selenide, gallium nitride, silicon germanium, or the like is used. Alternatively, a semiconductor material including an organic material, a semiconductor material including a metal oxide, or the like can be used.

In the semiconductor layer 106, the crystal grains 112 which form a carrier path exist. The conductivity of the crystal grains 112 is preferably high as compared with the conductivity of a base of the semiconductor layer 106. For example, when the base of the semiconductor layer 106 is an amorphous semiconductor, the above-mentioned condition is satisfied. As described above, the semiconductor layer 106 includes the crystal grains 112 having a high crystallinity; thus, it is possible to separate and extract generated electrons and holes as current before recombination of the electrons and the holes. Accordingly, photoelectric conversion efficiency can be significantly improved.

It is preferable that a carrier path exist continuously from the semiconductor layer 104 to the semiconductor layer 108. For example, a structure in which the crystal grains 112 are linearly arranged from the semiconductor layer 104 toward the semiconductor layer 108 is preferably employed. In order to show practical effect of the carrier path, a distance between the crystal grains 112 which are linearly arranged as described above is less than or equal to 5 μm, preferably about 50 nm to 1 μm. Thus, annihilation of carriers caused by recombination can be efficiently suppressed.

There is no limitation on a material of the crystal grains 112 as long as the conductivity thereof is higher than that of the base of the semiconductor layer 106. For example, a material which is the same as the material of the base of the semiconductor layer 106 and which has preferable crystallinity may be used as the crystal grains. Alternatively, crystal grains formed using a material which is different from the material of the base of the semiconductor layer 106 may be used. When the contact resistance between the base of the semiconductor layer 106 and the crystal grains 112 is high, generated carriers do not flow into the crystal grains 112, leading to reduction in the effect of the carrier path. Therefore, combination of materials which makes low contact resistance between the base of the semiconductor layer 106 and the crystal grains 112 is preferably employed. In this embodiment, amorphous silicon is used for the base of the semiconductor layer 106 and crystalline silicon is used for the crystal grains 112.

There is no particular limitation on the size of the crystal grain 112. For example, a crystal grain whose diameter is about 1 nm to 10 nm can be used.

Here, equation of the sizes or arrangement interval of the crystal grains 112 can bring benefit due to the quantum size effect. For example, as for the crystal grain 112, the size is less than or equal to 20 nm, the arrangement interval is less than or equal to 20 nm, and variation in size (diameter) is less than 10%. The crystal grains 112 are arranged in the semiconductor layer 106 in such a manner, so that a periodical quantum well structure and a miniband are formed in the semiconductor layer 106. In the miniband, carriers are transported at a high speed; thus, loss due to recombination can be suppressed. Further, a plurality of minibands is formed in the quantum well, which makes it possible to absorb light having various energy. As described above, photoelectric conversion efficiency can be significantly improved by the quantum size effect of the crystal grains 112.

Note that a texture structure or the like may be provided for a surface of the semiconductor layer 106 in a manner similar to the surface of the substrate 100.

<Second Electrode>

As the second electrode 110, an electrode using a metal material, such as aluminum, platinum, gold, silver, copper, titanium, tantalum, or tungsten, is typically used. In particular, a material that easily reflects light such as aluminum, silver, titanium, or tantalum is preferably used because light that cannot be absorbed by the semiconductor layer 106 can be incident on the semiconductor layer 106 again; thus, photoelectric conversion efficiency can be improved.

Note that in this embodiment, the above-mentioned structure is used since the structure in which light enters from the bottom surface side of the substrate 100 (the lower side in the diagram) is employed. However, the structure of the second electrode 110 is not limited thereto. A conductive material having a light-transmitting property may be used for forming the second electrode 110 as well as the first electrode 102.

Further, a texture structure or the like may be provided for a surface of the second electrode 110. Furthermore, an auxiliary electrode formed using a low-resistant conductive material may be formed to be in contact with the second electrode 110.

As described above, the crystal grains having a high conductivity are included in the semiconductor layer having an effect of photoelectric conversion, so that a carrier path is formed, which can improve the function of transporting carriers. Accordingly, the collection efficiency is improved, whereby the conversion efficiency of the photoelectric conversion device can be increased.

(Embodiment 2)

In this embodiment, an example of a tandem photoelectric conversion device is described with reference to FIG. 2. Note that although a structure in which two unit cells are stacked is described in this embodiment, three or more unit cells may be stacked.

<Structure of Photoelectric Conversion Device>

Figure 2:
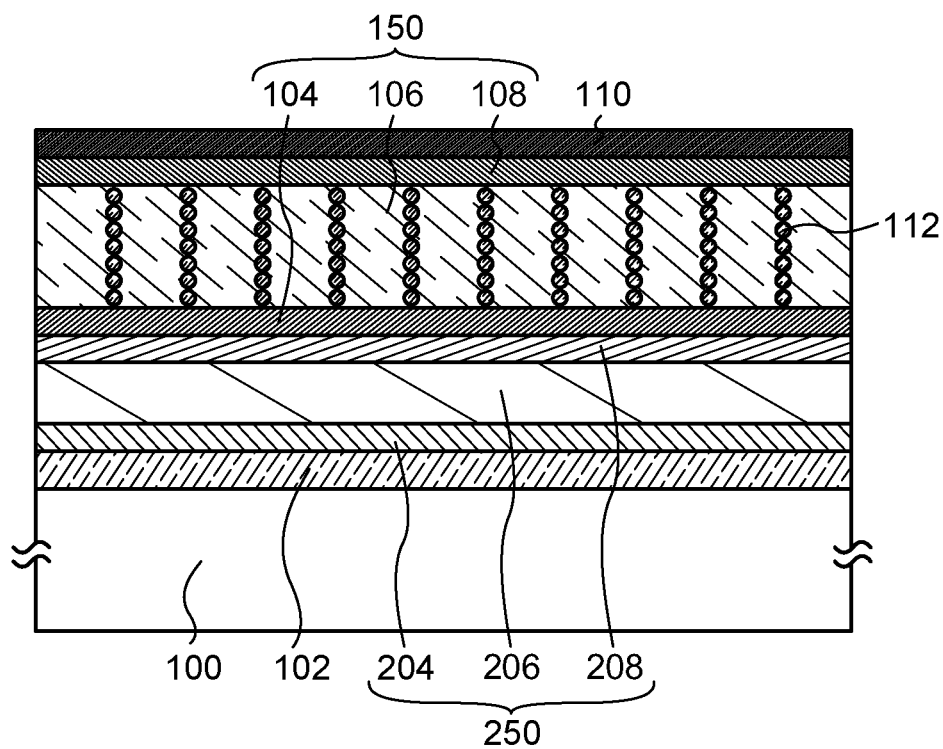
FIG. 2 is a cross-sectional view illustrating one example of a photoelectric conversion device.

A photoelectric conversion device illustrated in FIG. 2 includes a structure in which the substrate 100, the first electrode 102, a unit cell 250 (a top cell), the unit cell 150 (a bottom cell), and the second electrode 110 are stacked. The semiconductor layer 104 exhibiting the first conductivity type, the semiconductor layer 106 having an effect of photoelectric conversion, and the semiconductor layer 108 exhibiting the second conductivity type are stacked to form the unit cell 150. A semiconductor layer 204 exhibiting a first conductivity type, a semiconductor layer 206 having an effect of photoelectric conversion, and a semiconductor layer 208 exhibiting a second conductivity type are stacked to form the unit cell 250. A band gap of the semiconductor layer 106 having an effect of photoelectric conversion and a band gap of the semiconductor layer 206 having an effect of photoelectric conversion are preferably different from each other. Use of semiconductors having different band gaps makes it possible to absorb light in a wide wavelength range; thus, photoelectric conversion efficiency can be improved.

The base of the semiconductor layer 106 having an effect of photoelectric conversion in the unit cell 150 is amorphous silicon and the crystal grains 112 which form a carrier path exist in the semiconductor layer 106. Similarly, crystal grains may be arranged in the semiconductor layer 206 in the unit cell 250. Note that although light enters from the bottom surface side of the substrate 100 (a lower side in the diagram) in this embodiment, one embodiment of the disclosed invention is not limited thereto, and light may enter from a second electrode 110 side (an upper side in the diagram).

Structures of the substrate 100, the first electrode 102, the unit cell 150, and the second electrode 110 are omitted in this embodiment because these structures are the same as the structures in Embodiment 1.

<Structure of Top Cell>

As the semiconductor layer 204 exhibiting the first conductivity type and the semiconductor layer 208 exhibiting the second conductivity type in the unit cell 250, a semiconductor layer including a semiconductor material to which an impurity element imparting a conductivity type is added is typically employed. Details of a semiconductor material and the like are the same as the description of the semiconductor layer 104 exhibiting the first conductivity type in the unit cell 150. In this embodiment, a case in which silicon is used as the semiconductor material, the first conductivity type is p-type, and the second conductivity type is n-type is described. It is possible that the first conductivity type is n-type and the second conductivity type is p-type.

For the semiconductor layer 206 having an effect of photoelectric conversion, the semiconductor material which is the same as that of the semiconductor layer 204 and the semiconductor layer 208 is used. That is, as the semiconductor material, silicon, silicon carbide, germanium, gallium arsenide, indium phosphide, zinc selenide, gallium nitride, silicon germanium, or the like is used. Alternatively, a semiconductor material including an organic material, a semiconductor material including a metal oxide, or the like can be used.

In this embodiment, silicon is used for the semiconductor layer 206, and crystalline silicon such as microcrystalline silicon or polycrystal silicon is preferably used for the semiconductor layer 206 since amorphous silicon is employed for the semiconductor layer 106 in the unit cell 150. A semiconductor material having a different band gap from a band gap of amorphous silicon except silicon may be used to form the semiconductor layer 206. The thickness of the semiconductor layer 206 is preferably smaller than that of the semiconductor layer 106.

The semiconductor layer formed using crystalline silicon is used in the top cell as described above, so that light with a long wavelength can be absorbed and converted into electricity. Further, the semiconductor layer formed using amorphous silicon is used in the bottom cell, so that light with a wavelength of less than 800 nm can be absorbed and converted into electricity. Such a structure in which unit cells having different band gaps are stacked (a so-called tandem structure) makes it possible to significantly increase photoelectric conversion efficiency.

In this embodiment, crystalline silicon having a small band gap is used in the top cell and amorphous silicon having a large band gap is used in the bottom cell; however, one embodiment of the disclosed invention is not limited thereto. The top cell and the bottom cell each can be formed by appropriate combination of semiconductor materials whose bad gaps are different from each other. The structure of the top cell and the structure of the bottom cell can be switched to form the photoelectric conversion device. Further, three or more unit cells can be stacked.

In this embodiment, the crystal grains having a high conductivity are included in the semiconductor layer having an effect of photoelectric conversion, so that a carrier path is formed, which improves the function of transporting carriers. Accordingly, the collection efficiency is improved, whereby the conversion efficiency of the photoelectric conversion device can be increased.

This embodiment can be combined with any of the other embodiments as appropriate.

(Embodiment 3)

In this embodiment, examples of a plasma CVD apparatus that can be used for manufacture of a photoelectric conversion device is described with reference to FIG. 3 to FIG. 6.

Figure 3:
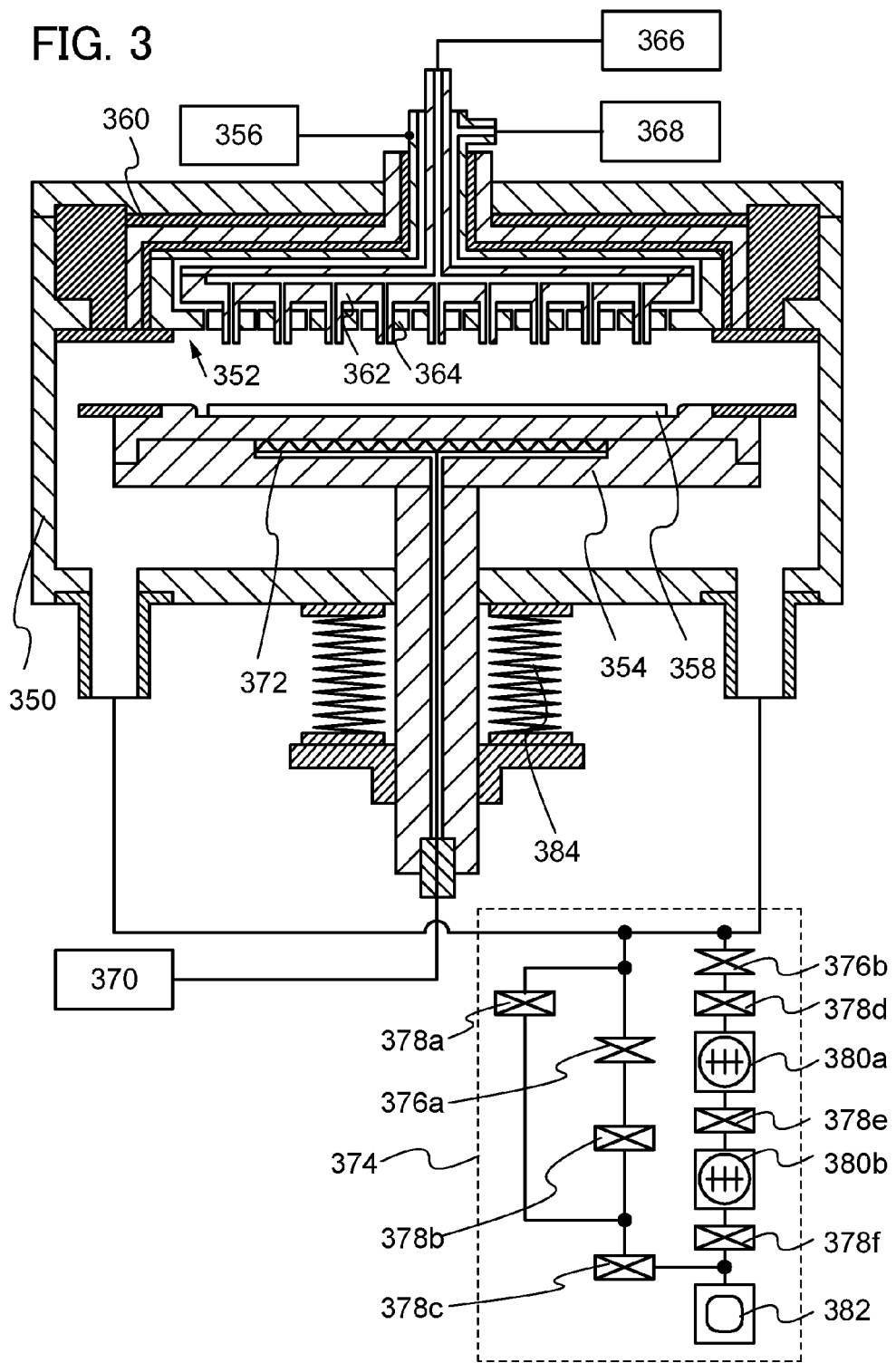
FIG. 3 is a diagram illustrating an example of a plasma CVD apparatus.

FIG. 3 illustrates a structure of a treatment chamber of a plasma CVD apparatus. A reaction chamber 350 is formed using a material having rigidity such as aluminum or stainless steel. The inside of the reaction chamber 350 can be vacuum-evacuated. The reaction chamber of the plasma CVD apparatus in this embodiment is formed using stainless steel in order to increase its mechanical strength, and the inside thereof is coated with aluminum by thermal spraying. In addition, the reaction chamber is disassembled, so that the inside thereof is regularly recoated with aluminum by thermal spraying. The reaction chamber 350 is provided with a first electrode 352 (also referred to as an upper electrode) and a second electrode 354 (also referred to as a lower electrode) which is opposite to the first electrode 352.

A high-frequency power supply unit 356 is connected to the first electrode 352. The second electrode 354 is grounded, and a substrate 358 can be placed on the second electrode 354. The first electrode 352 is insulated from the reaction chamber 350 by an insulating material 360 so that high-frequency power does not leak. In the case where a ceramic material is used for the insulating material 360, it is difficult to use a knife-edge-type metal-seal flange for sealing of the upper electrode and thus, an O-ring seal is preferably used.

In FIG. 3, a capacitively coupled type structure (a parallel plate type structure) including the first electrode 352 and the second electrode 354 is illustrated; however one embodiment of the disclosed invention is not limited to this structure. Another structure such as an inductively coupled type structure may be employed as long as glow discharge plasma can be produced in the reaction chamber 350 by supplying high-frequency power.

The first electrode 352 includes a plate electrode member 364 and a projecting member 362 for forming an electrode, which sticks out of a flat surface of the plate electrode member 364. In FIG. 3, the inside of the projecting member 362 for forming an electrode of the first electrode 352 is a hollow portion and a gas supplied from a gas supply unit 366 flows into the hollow portion. There is a hollow portion inside the plate electrode member 364 of the first electrode 352 and a gas supplied from a gas supply unit 368 flows into the hollow portion. Such a structure can make a kind of a gas supplied from the projecting member 362 for forming an electrode to the reaction chamber 350 and a kind of a gas supplied from the plate electrode member 364 to the reaction chamber 350 different. Alternatively, the structure can make the flow ratio of the gas supplied from the projecting member 362 for forming an electrode to the reaction chamber 350 and the gas supplied from the plate electrode member 364 to the reaction chamber 350 different. Further alternatively, the structure can make timing when a gas is supplied from the projecting member 362 for forming an electrode to the reaction chamber 350 and timing when a gas is supplied from the plate electrode member 364 to the reaction chamber 350 different.

The gas supply unit 366 and the gas supply unit 368 each include a cylinder filled with a gas, a pressure adjusting valve, a stop valve, a mass flow controller, and the like. The gas supply unit 366 and the gas supply unit 368 each include a cylinder filled with a deposition gas containing silicon or germanium. Alternatively, a cylinder filled with hydrogen or a cylinder filled with a rare gas may be included. Examples of the deposition gas containing silicon or germanium include a silane ($SiH_4$) gas, a disilane ($Si_2H_6$) gas, a silane fluoride ($SiF_4$) gas, a germane ($GeH_4$) gas, a digermane ($Ge_2H_6$) gas, and a germane fluoride ($GeF_4$) gas; however, any other deposition gas may be used. Examples of the rare gas include a helium gas, a neon gas, and an argon gas.

A substrate heater 372, a temperature of which is controlled by a heater controller 370, is provided in the second electrode 354. In the case where the substrate heater 372 is provided in the second electrode 354, a thermal conduction heating method is employed. For example, a sheathed heater is used for the substrate heater 372.

The high-frequency power supply unit 356 includes a high-frequency power source, a matching box, a high-frequency cut filter, and the like. High-frequency power supplied from the high-frequency power source is supplied to the first electrode 352.

The high-frequency power source supplies a high frequency of 60 MHz or less. In the case where a large substrate of the seventh or later generation is used as a substrate placed on the second electrode 354, the high-frequency power source preferably supplies high frequency with a wavelength of approximately 10 m or more. Typically, it is preferable that a frequency of greater than or equal to 1 MHz and less than or equal to 150 MHz (for example, 13.56 MHz) be supplied. When the high-frequency power source supplies a high frequency within the above range, even if the large substrate of the seventh or later generation is placed on the second electrode 354 and glow discharging is performed, plasma can be generated uniformly over the large substrate without an adverse effect of a surface standing wave; therefore, a film which is uniform and has good film quality can be formed over an entire surface of the substrate.

When high-frequency power with a frequency of 13.56 MHz is used for the high-frequency power source, a variable capacitor with a capacitance of 10 pF to 100 pF is used for the high-frequency cut filter. Further, for the high-frequency cut filter, a parallel resonance circuit using a coil and a variable capacitor may be formed.

An evacuation unit 374 connected to the reaction chamber 350 has a function of vacuum evacuation and a function of controlling the reaction chamber 350 to be kept at a predetermined pressure in the case of supplying a reaction gas. The evacuation unit 374 includes a butterfly valve 376*a*, a butterfly valve 376*b*, a stop valve 378*a*, a stop valve 378*b*, a stop valve 378*c*, a stop valve 378*d*, a stop valve 378*e*, a stop valve 378*f*, a turbo molecular pump 380*a*, a turbo molecular pump 380*b*, a dry pump 382, and the like. Note that the turbo molecular pump 380*b* is connected to the dry pump 382 through the stop valve 378*f*.

In the case of vacuum-evacuation of the reaction chamber 350, first, the stop valve 378*a* and the stop valve 378*c* for rough vacuum are opened and the reaction chamber 350 is evacuated with the dry pump 382. Then, the stop valve 378*a* is closed and the butterfly valve 376*a* and the stop valve 378*b* are opened for vacuum evacuation. In the case of performing ultrahigh vacuum evacuation to obtain a pressure lower than $10^{-5}$ Pa in the reaction chamber 350, the reaction chamber 350 is evacuated with the dry pump 382 in the above manner, the butterfly valve 376*a* and the stop valves 378*b* and 378*c* are closed, the butterfly valve 376*b* and the stop valves 378*b*, 378*d*, 378*e*, 378*f* are opened, and then vacuum evacuation is performed using the turbo molecular pumps 380*a* and 380*b* and the dry pump 382 which are connected in series. In addition, after the vacuum evacuation is performed, the reaction chamber 350 is preferably subjected to heat treatment so that degassing of the inner wall is performed.

A distance (also referred to as a gap) between the first electrode 352 and the second electrode 354 can be adjusted as appropriate. The gap between the electrodes can be adjusted by adjustment of the height of the second electrode 354 in the reaction chamber 350. By using a bellows 384, the gap between the electrodes can be adjusted with the reaction chamber 350 maintained in a vacuum.

Figure 4:
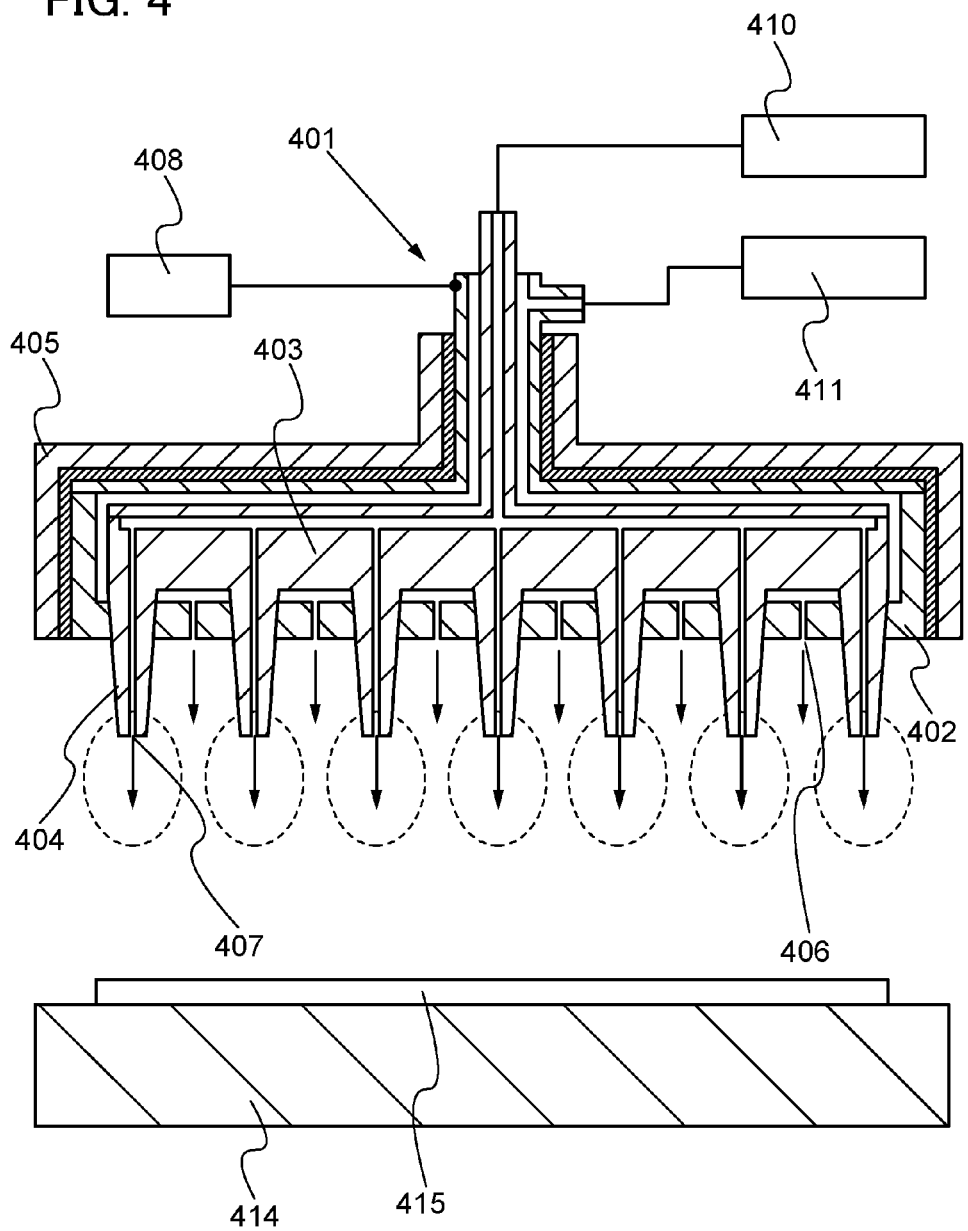
FIG. 4 is a cross-sectional view illustrating a structure of an electrode for generating plasma provided in a reaction chamber of a plasma CVD apparatus.
Figure 5:
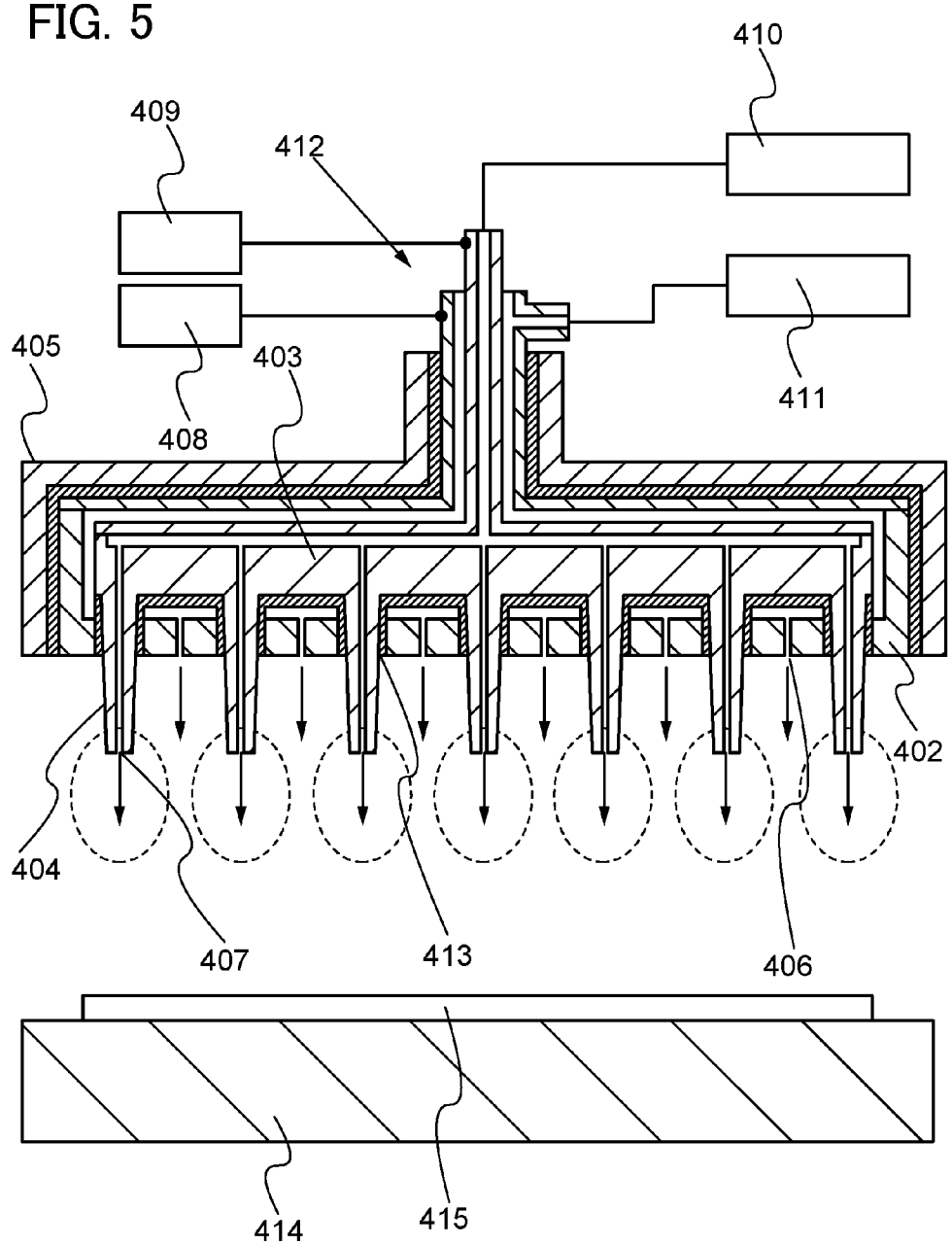
FIG. 5 is a cross-sectional view illustrating a structure of an electrode for generating plasma provided in a reaction chamber of a plasma CVD apparatus.
Figure 6:
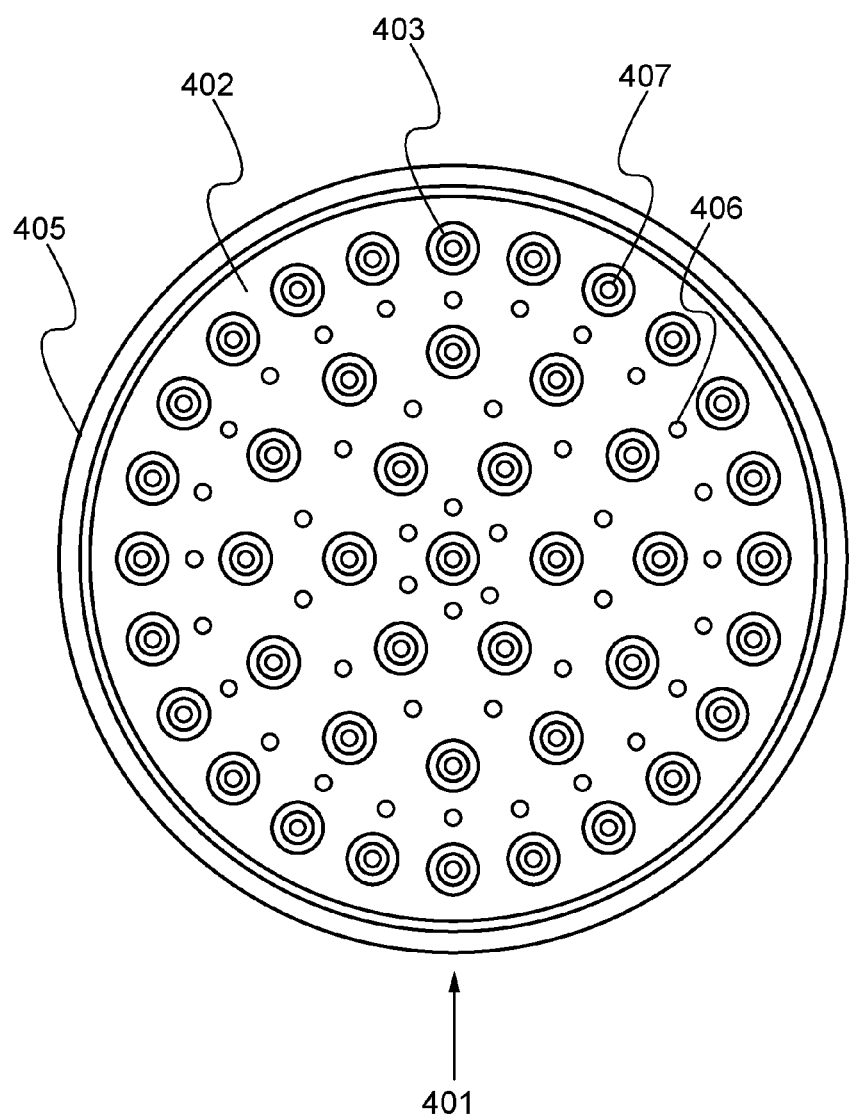
FIG. 6 is a plan view illustrating a structure of an electrode for generating plasma provided in a reaction chamber of a plasma CVD apparatus.

Next, an electrode for plasma generation provided in the reaction chamber of the plasma CVD apparatus is described. FIG. 4 is a cross-sectional view illustrating a structure of the first electrode provided in the plasma CVD apparatus and FIG. 6 is a plan view thereof. FIG. 5 is a cross-sectional view illustrating another structure of the first electrode. Hereinafter description is made with reference to FIG. 4 to FIG. 6.

The first electrode includes a plate electrode member 402 and a projecting member 403 for forming an electrode, which sticks out of a flat surface of the plate electrode member 402. The plate electrode member 402 and the projecting member 403 for forming an electrode are formed using a metal material and have a conductive property. The plate electrode member 402 and the projecting member 403 for forming an electrode are electrically connected with each other and operate so that plasma (glow discharge plasma) is generated in the reaction chamber of the plasma CVD apparatus when power is supplied from a high-frequency power source 408. A back surface of the plate electrode member 402 (a surface opposite to a surface from which a needle of the projecting member 403 for forming an electrode projects) is provided with an electrode hood 405 so that plasma is prevented from spreading to a wall surface of the reaction chamber.

The first electrode is formed as follows: a projecting electrode 404 of the projecting member 403 for forming an electrode sticks out of a flat surface of the plate electrode member 402, and the other portion of the projecting member 403 for forming an electrode is provided inside the plate electrode member 402.

There is a hollow between the plate electrode member 402 and the projecting member 403 for forming an electrode so that a gas supplied from a gas supply unit 411 flows. The gas supplied to the hollow flows into the inside of the reaction chamber through a gas supply port 406.

There is also a hollow inside the projecting member 403 for forming an electrode, and a gas supplied from a gas supply unit 410 flows into the hollow. The projecting electrode 404 of the projecting member 403 for forming an electrode is provided with a gas supply port 407, and the gas supplied to the hollow flows into the inside of the reaction chamber.

In such a manner, a double-hollow structure is formed inside the first electrode 401; thus, different reaction gases can be supplied to the inside of the reaction chamber of the plasma CVD apparatus through different paths.

Plasma (glow discharge plasma) is generated in the inside of the reaction chamber of the plasma CVD apparatus by the first electrode 401 which is provided with the plate electrode member 402 and the projecting member 403 for forming the electrode. Distribution of the plasma generated by the first electrode 401 can be different in the peripheral region of the projecting electrode 404. The projecting electrode 404 sticks out of the flat surface of the plate electrode member 402; thus, electric field concentration occurs, leading to increase in the plasma density. Further, the projecting electrode 404 operates so that the electron temperature is high. Such a structure can relieve the influence of a surface standing wave which is caused when the size of the plate electrode is increased up to about the wavelength of a discharge frequency. This is because the projecting electrode 404 generates plasma independently of the flat surface.

The structure of the first electrode 401 makes it possible that a specific reaction gas is supplied to a region having a high plasma density. Further, a specific deposition precursor can be selectively generated by the structure of the first electrode 401. Accordingly, a composition and/or a structure of a film to be deposited can be controlled.

A structure of a first electrode 412 in which the plate electrode member 402 and the projecting member 403 for forming an electrode are insulated from each other by an insulating member 413 is illustrated in FIG. 5. Such a structure enables that different power is supplied to the plate electrode member 402 and the projecting member 403 for forming an electrode and plasma is generated. For example, it is possible that power to the plate electrode member 402 is supplied from the high-frequency power source 408 and power to the projecting member 403 for forming an electrode is supplied from a high-frequency power source 409. Note that the plan structure of the first electrode 412 is the same as the plan structure illustrated in FIG. 6.

As a power supply method to the first electrode 412, for example, high-frequency power of greater than or equal to 1 MHz and less than 30 MHz (for example 13.56 MHz or 27 MHz) is supplied to the plate electrode member 402 from the high-frequency power source 408, and high-frequency power of greater than or equal to 30 MHz and less than or equal to 150 MHz is supplied to the projecting member 403 for forming an electrode from the high-frequency power source 409. Further, continuous-wave high-frequency power is supplied from the high-frequency power source 408 to the plate electrode member 402 and pulsed-wave high-frequency power is supplied from the high-frequency power source 409 to the projecting member 403 for forming an electrode.

Such a structure of the first electrode 412 makes it possible that a specific reaction gas is supplied to a region having a high plasma density and that when a specific deposition precursor is selectively generated, the amount of the generated deposition precursor and the generation timing thereof are independently controlled. A supply path of the reaction gas can be only the gas supply port 407 of the projecting electrode 404.

Note that the structures of the supply path of the reaction gas, the projecting electrode 404, and the like in the first electrode 412 are the same as those in the first electrode 401 illustrated in FIG. 4.

In the case where the first electrode 401 in FIG. 4 or the first electrode 412 in FIG. 5 is used in a capacitively coupled type plasma CVD apparatus, a region having a high plasma density can be formed in the reaction chamber. The region having a high plasma density can be changed according to the number of the projecting electrodes 404 of the first electrode 401 or the first electrode 412.

In a deposition process of a thin film, when a deposition gas is supplied to the region having a high plasma density, molecules of the gas are dissociated and a radical is generated. An active radical having a short lifetime is generated in the region having a high plasma density, and the radical reacts in the phase, so that a nucleus is generated. After the generation of the nucleus, reaction proceeds successively; thus, a nanometer-size particle can be grown. In the first electrodes 401 and 412 according to this embodiment, plasma (glow discharge plasma) is generated on the flat surface of the plate electrode member 402. Accordingly, a thin film can be deposited over the substrate along with generation of the nanoparticle.

When the nucleus of the nanoparticle is generated, a higher radical adheres to the nucleus, so that the nanoparticle grows. Generation of new nuclei is suppressed since radicals needed for forming new nuclei are consumed for the growth of the nuclei.

The size and the amount of generated nanoparticles can be controlled by controlling time period of power supply to the projecting member 403 for forming an electrode (e.g., a pulse width or a pulsed frequency in pulsed-wave power), the flow rate of a gas, the evacuation speed of a gas, and the pressure in the reaction chamber. When the distance between the first electrode and a counter electrode 414 on which a substrate 415 is placed is short, discharge can be performed even if the pressure in the reaction chamber is relatively high (e.g., 1000 Pa). In the case where the pressure in the reaction chamber is high, a probability that generated nuclei react with a base gas (e.g., silane) is increased, so that generation of nanoparticles is promoted.

The composition of the nanoparticle can be controlled by selection of a supplied gas, because radicals which are generated in plasma are different depending on the kinds of gases. Thus, a nanoparticle having a multi-layer structure can be generated with plural kinds of deposition gases which are switched during the growth of the nanoparticle.

In plasma, a nanoparticle is likely to be negatively charged. Flocculation of nanoparticles is suppressed due to Coulomb force, which is caused by the discharge. Therefore, according to the plasma CVD apparatus in this embodiment, substantially monodisperse nanoparticles can be obtained in a high density.

In addition to the kinds of radicals which contribute to the growth of nanoparticles, the temperature of the nanotemperature is important for a structure of the nanotemperature. The temperature of the nanoparticle is determined depending on the effects of ion incident to a surface of the nanoparticle, electronic kinetic energy, energy release and absorption at the surface due to chemical reaction, heating and cooling caused by collision of gas molecules, and the like.

For example, in the case where nanoparticles of silicon are generated, a crystal structure can be formed by dilution of silane ($SiH_4$) with hydrogen. It is considered that this mechanism is the same as that of a surface reaction which occurs when a microcrystal silicon film is deposited. In other words, it is considered that reaction between hydrogen and radical that is generated by dissociation from silane mainly contributes for generation of a nanoparticle of silicon having a crystal structure.

In this case, a silane gas or a silane gas diluted with hydrogen is supplied through the gas supply port 407 and hydrogen is supplied through the gas supply port 406. Such a gas supply method promotes crystallization of the nanoparticle. When a gas supplied through the gas supply port 406 is a silane gas or a silane gas diluted with hydrogen, growth of the nanoparticle is promoted; thus, the deposition rate of a film formed over the substrate 415 can be improved. On the other hand, when the gas supplied through the gas supply port 406 is a rare gas such as xenon, krypton, or argon, excited species of the rare gas promotes decomposition of silane, leading to contribution for generating a higher radical.

In such a manner, crystalline nanoparticles which are formed in the phase can be transported to a surface of the substrate and can be included in the film to be deposited. Further, the nanoparticle can be used as nuclei as a nucleus for crystal growth over the substrate.

This embodiment can be combined with any of the other embodiments as appropriate.

(Embodiment 4)

In this embodiment, a process for manufacturing the photoelectric conversion device illustrated in FIG. 1 is described with reference to FIGS. 7A to 7D and FIGS. 8A and 8B.

<Manufacture of First Electrode>

Figure 7A:
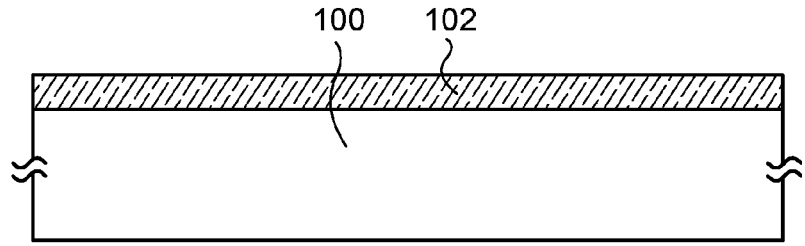
FIGS. 7A to 7D are cross-sectional views illustrating an example of a process for manufacturing a photoelectric conversion device.

First, the first electrode 102 is formed over the substrate 100 (see FIG. 7A). The aforementioned embodiment can be referred to for the detailed description of the substrate 100.

The first electrode 102 is formed using a conductive material having a light-transmitting property such as a metal oxide. For example, the first electrode 102 can be formed using indium oxide, an alloy of indium oxide and tin oxide (ITO), zinc oxide, or an alloy of indium oxide and zinc oxide. The aforementioned embodiment can be referred to for the detailed description of the material that can be used for the first electrode 102. As a method for forming the first electrode 102, a sputtering method, a vacuum evaporation method, and the like are given.

The first electrode 102 is formed to have a thickness of 10 nm to 500 nm, preferably 50 nm to 100 nm and a sheet resistance of about 20 Ω/square to 200 Ω/square.

Note that in this embodiment, the first electrode 102 is formed using the conductive material having a light-transmitting property since a structure in which light enters from the bottom surface side of the substrate 100 (the lower side in the diagram) is employed. However, when the structure in which light enters from the second electrode 110 side (an upper side in the diagram) is employed, the electrode is not limited to an electrode formed using the conductive material having a light-transmitting property. In such a case, the first electrode 102 can be formed using a material not having light-transmitting property such as aluminum, platinum, gold, silver, copper, titanium, tantalum, or tungsten. In particular, when a material that easily reflects light such as aluminum, silver, titanium, or tantalum is used, photoelectric conversion efficiency can be sufficiently improved.

Further, an auxiliary electrode formed using a low-resistant conductive material may be formed to be in contact with the first electrode 102.

<Manufacture of Semiconductor Layer exhibiting First Conductivity Type>

Figure 7B:
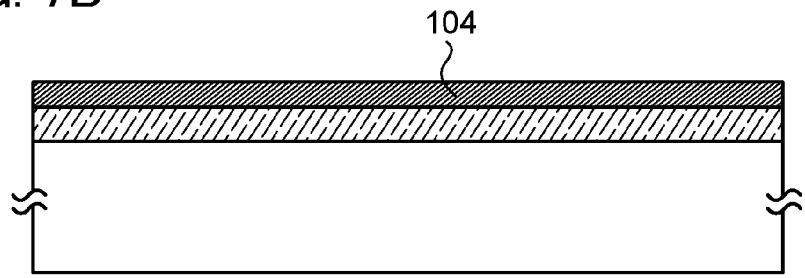

Next, the semiconductor layer 104 exhibiting the first conductivity type is formed over the first electrode 102 (see FIG. 7B). For example, the semiconductor layer 104 exhibiting the first conductivity type can be formed using, for example, silicon to which boron is added as an impurity element imparting a conductivity type. The aforementioned embodiment can be referred to for the detailed description of the material that can be used for the semiconductor layer 104 exhibiting the first conductivity type.

As a method for forming the semiconductor layer 104 exhibiting the first conductivity type, a plasma CVD method or the like is given. In the case of using the plasma CVD method, for example, a silane-based gas is diluted with hydrogen and diborane is added, so that the semiconductor layer 104 exhibiting the first conductivity type can be formed. The semiconductor layer 104 exhibiting the first conductivity type is formed to have a thickness of 1 nm to 100 nm, preferably 5 nm to 50 nm Note that the silane-based gas is not limited to a gas using silane (so-called monosilane) and disilane ($Si_2H_6$) or the like may be used. Further, a rare gas may be added to the aforementioned source gas.

Alternatively, the semiconductor layer 104 exhibiting the first conductivity type may be formed as follows: a silicon layer to which an impurity element imparting a conductivity type is not added is formed by a plasma CVD method or the like; and boron is added by an ion implantation method or the like.

Note that in this embodiment, the conductivity type (the first conductivity type) of the semiconductor layer 104 exhibiting the first conductivity type is preferably p-type since a structure in which light enters from the bottom surface side of the substrate 100 (the lower side in the diagram) is employed. The reasons of this are that lifetime of a hole is about a half as lifetime of an electron, leading to a short diffusion length, and that holes and electrons are likely to be formed on the semiconductor layer 106 having an effect of photoelectric conversion side from which light enters. The first conductivity type is p-type as described above, so that electrons and holes can be extracted as current before annihilation of the holes. Accordingly, decrease in photoelectric conversion efficiency can be suppressed. Note that the first conductivity type may be n-type when there are no problem in view of the above reasons, for example, in the case where the thickness of the semiconductor layer 106 having an effect of photoelectric conversion is sufficiently small.

<Manufacture of Semiconductor Layer having Effect of Photoelectric Conversion>

Figure 7C:
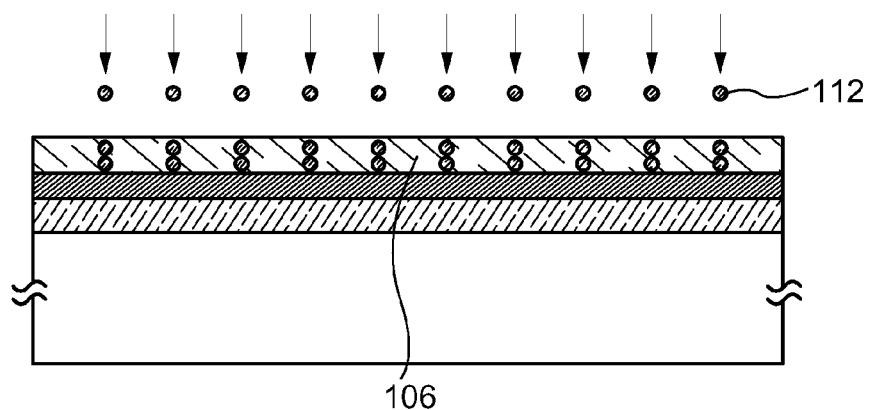
Figure 7D:
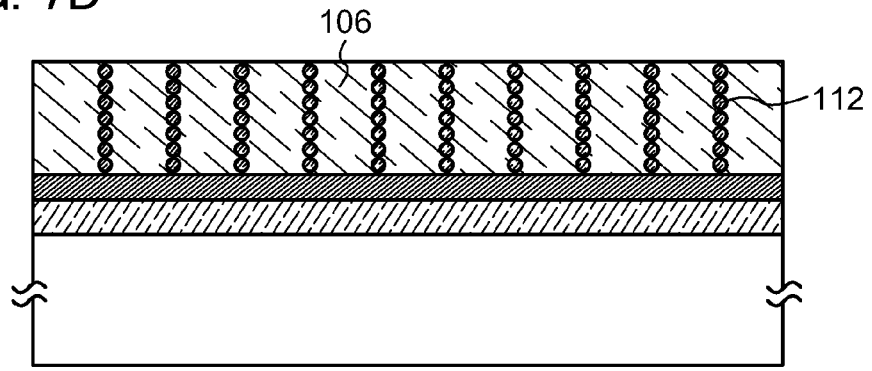

The semiconductor layer 106 having an effect of photoelectric conversion is formed over the semiconductor layer 104 exhibiting the first conductivity type (see FIGS. 7C and 7D). For example, the semiconductor layer 106 having an effect of photoelectric conversion can be formed using silicon or the like. The aforementioned embodiment can be referred to for the detailed description of the material that can be used for the semiconductor layer 106 having an effect of photoelectric conversion.

As a method for forming the semiconductor layer 106 having an effect of photoelectric conversion, a plasma CVD method or the like is given. The crystal grains 112 which form a carrier path are formed in the semiconductor layer 106 in this embodiment. For example, the semiconductor layer 106 including the crystal grains 112 is formed with the plasma CVD apparatus described in the above embodiment.

Note that the semiconductor layer 106 having an effect of photoelectric conversion has preferably a thickness of about 100 nm to 10 μm so that the semiconductor layer 106 having an effect of photoelectric conversion absorbs light enough.

As described above, the semiconductor layer 106 includes the crystal grains 112 having a high crystallinity; thus, it is possible to separate and extract generated electrons and holes as current before recombination of the electrons and the holes. Accordingly, photoelectric conversion efficiency can be significantly improved.

Note that the aforementioned embodiment can be referred to for the detailed description of the crystal grains 112.

<Manufacture of Semiconductor Layer exhibiting Second Conductivity Type>

Figure 8A:
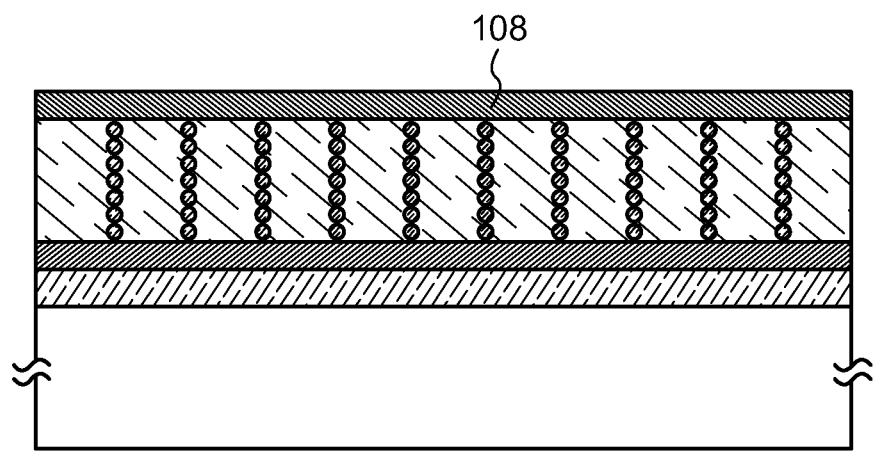
FIGS. 8A and 8B are cross-sectional views illustrating an example of a process for manufacturing a photoelectric conversion device.

The semiconductor layer 108 exhibiting the second conductivity type is formed over the semiconductor layer 106 having an effect of photoelectric conversion (see FIG. 8A). For example, the semiconductor layer 108 exhibiting the second conductivity type can be formed using, for example, silicon to which phosphorus is added as an impurity element imparting a conductivity type. The aforementioned embodiment can be referred to for the detailed description of the material that can be used for the semiconductor layer 108 exhibiting the second conductivity type.

A method for forming the semiconductor layer 108 exhibiting the second conductivity type is the same as the method for forming the semiconductor layer 104 exhibiting the first conductivity type. For example, a silane-based gas is diluted with hydrogen and phosphine is added, so that the semiconductor layer 108 exhibiting the second conductivity type can be formed.

Note that in this embodiment, the conductivity type (a second conductivity type) of the semiconductor layer 108 exhibiting the second conductivity type is n-type since a structure in which light enters from the bottom surface side of the substrate 100 (the lower side in the diagram) is employed; however, one embodiment of the disclosed invention is not limited to this. In the case where the first conductivity type is n-type, the second conductivity type is p-type.

Through the above steps, the unit cell 150 including the semiconductor layer 104 exhibiting the first conductivity type, the semiconductor layer 106 having an effect of photoelectric conversion, and the semiconductor layer 108 exhibiting the second conductivity type is manufactured.

<Manufacture of Second Electrode>

Figure 8B:
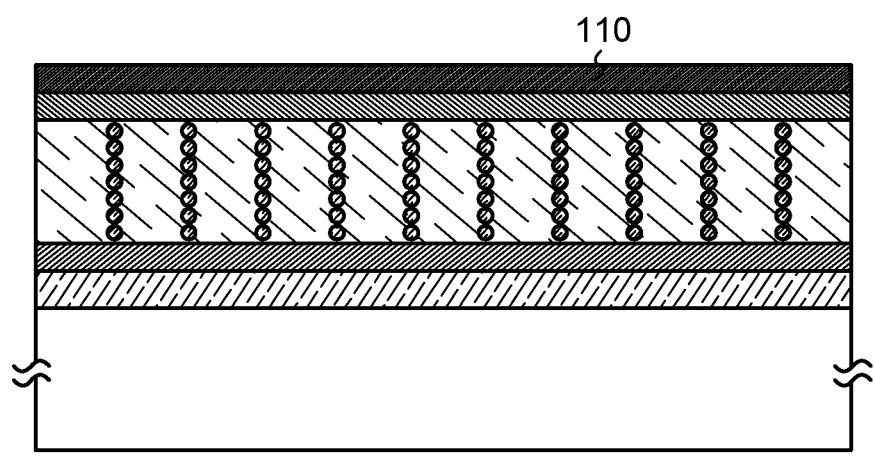

Then, the second electrode 110 is formed over the semiconductor layer 108 exhibiting the second conductivity type (see FIG. 8B). The second electrode 110 is formed using a conductive material such as metal. For example, a material that easily reflects light such as aluminum, silver, titanium, or tantalum can be used for the formation. In this case, such a material is preferably used because light that cannot be absorbed by the semiconductor layer 106 can be incident on the semiconductor layer 106 again; thus, photoelectric conversion efficiency can be improved. The aforementioned embodiment can be referred to for the detailed description of the material that can be used for the second electrode 110.

As a method for forming the second electrode 110, a sputtering method, a vacuum evaporation method, or the like are given. The second electrode 110 is formed to have a thickness of 10 nm to 500 nm, preferably 50 nm to 100 nm.

Note that in this embodiment, the second electrode 110 is formed using a material not having a light-transmitting property since a structure in which light enters from the bottom surface side of the substrate 100 (the lower side in the diagram) is employed. However, the structure of the second electrode 110 is not limited thereto. For example, when a structure in which light enters from the second electrode 110 side (an upper side in the diagram) is employed, the second electrode 110 is formed using a conductive material having a light-transmitting property such as a metal oxide. The aforementioned embodiment can be referred to for the detailed description of the conductive material having a light-transmitting property.

Note that an auxiliary electrode formed using a low-resistant conductive material may be formed to be in contact with the second electrode 110.

A photoelectric conversion device in which the semiconductor layer having an effect of photoelectric conversion, which includes crystal grains having a high conductivity, can be manufactured by the above-mentioned method. This embodiment can be combined with any of the other embodiments as appropriate.

(Embodiment 5)

In this embodiment, a process for manufacturing the photoelectric conversion device illustrated in FIG. 2 is described with reference to FIGS. 9A to 9D and FIGS. 10A and 10B. A manufacture process in this embodiment includes steps which are the same as the steps in the aforementioned embodiment. The aforementioned embodiment is referred to for the same steps in the aforementioned embodiment and the detailed description thereof is omitted here.

<Manufacture of First Electrode>

Figure 9A:
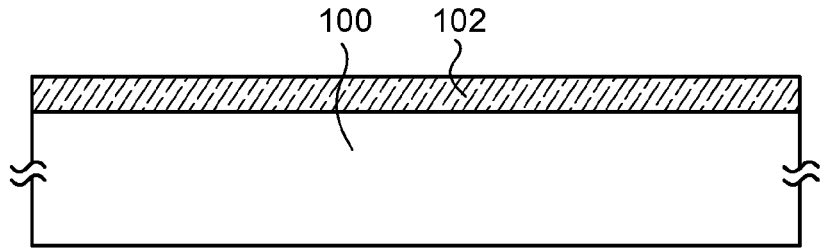
FIGS. 9A or 9D are cross-sectional views illustrating an example of a process for manufacturing a photoelectric conversion device.

First, the first electrode 102 is formed over the substrate 100 (see FIG. 9A). The aforementioned embodiment can be referred to for the detailed description of this step.

<Manufacture of Semiconductor Layer exhibiting First Conductivity Type (Top Cell)>

Figure 9B:
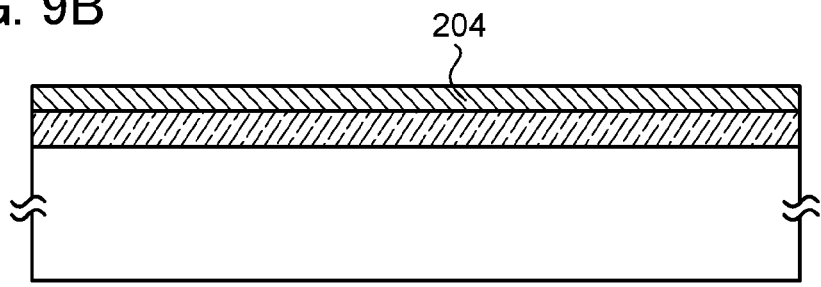

Next, the semiconductor layer 204 exhibiting the first conductivity type included in the top cell (the unit cell 250) is formed over the first electrode 102 (see FIG. 9B). In the top cell, crystalline silicon is used for the semiconductor layer having an effect of photoelectric conversion. Thus, crystalline silicon whose crystallinity is about the same as that of the semiconductor layer having an effect of photoelectric conversion is preferably used for the semiconductor layer 204 exhibiting the first conductivity type.

For example, the semiconductor layer 204 exhibiting the first conductivity type can formed using silicon to which boron is added as an impurity element imparting a conductivity type, or the like. Note that the aforementioned embodiment can be referred to for the detailed description of other materials which can used for the semiconductor layer 204 exhibiting the first conductivity type.

A plasma CVD method or the like is given as a method for forming the semiconductor layer 204. In the case of using the plasma CVD method, for instance, a silane-based gas is diluted with hydrogen and diborane is added, so that the semiconductor layer 204 exhibiting the first conductivity type can be formed. At this time, the flow rate of hydrogen is made high with respect to the flow rate of the silane-based gas; thus, a crystalline silicon layer (e.g., a microcrystalline silicon layer) can be formed. The crystallinity of the semiconductor layer may be improved by heat treatment after the film formation. The semiconductor layer 204 exhibiting the first conductivity type is formed to have a thickness of 1 nm to 100 nm, preferably 5 nm to 50 nm The silane-based gas is not limited to a gas using silane (so-called monosilane) and disilane ($Si_2H_6$) or the like may be used. Further, a rare gas may be added to the aforementioned source gas.

Alternatively, the semiconductor layer 204 exhibiting the first conductivity type may be formed as follows: a silicon layer to which an impurity element imparting a conductivity type is not added is formed by a plasma CVD method or the like; and boron is added by an ion implantation method or the like.

Note that in this embodiment, the conductivity type (the first conductivity type) of the semiconductor layer 204 exhibiting the first conductivity type is preferably p-type since a structure in which light enters from the bottom surface side of the substrate 100 (the lower side in the diagram) is employed. However, the first conductivity type can be n-type.

<Manufacture of Semiconductor Layer having Effect of Photoelectric Conversion (Top Cell)>

Figure 9C:
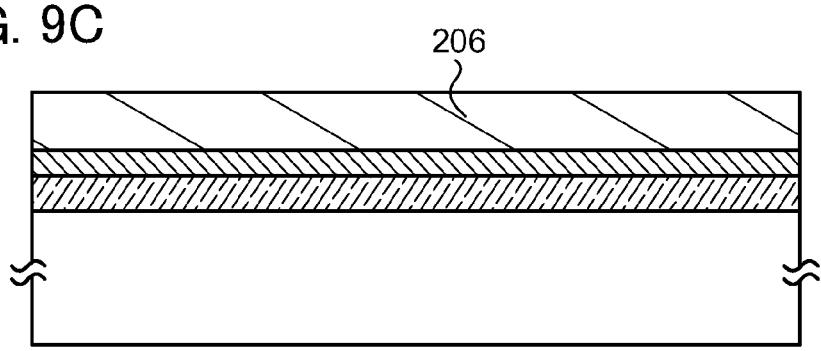

The semiconductor layer 206 having an effect of photoelectric conversion is formed over the semiconductor layer 204 exhibiting the first conductivity type (see FIG. 9C). For example, the semiconductor layer 206 having an effect of photoelectric conversion can be formed using silicon or the like. In this embodiment, crystalline silicon is used for the semiconductor layer 206 having an effect of photoelectric conversion.

A plasma CVD method or the like is given as a method for forming the semiconductor layer 206. In the case of using the plasma CVD method, the semiconductor layer 206 can be formed using a silane-based gas diluted with hydrogen. In this embodiment, the flow rate of hydrogen with respect to the silane-based gas is made high as compared with the case of forming the semiconductor layer (an amorphous silicon layer) included in the bottom cell (the unit cell 150). Thus, a crystalline silicon layer (e.g., a microcrystalline silicon layer) can be formed as the semiconductor layer 206. The crystallinity of the semiconductor layer may be improved by heat treatment or the like after the film formation.

The thickness of the semiconductor layer 206 having an effect of photoelectric conversion is preferably about 10 nm to 1 μm because when the thickness is made too thick, it is difficult to ensure the amount of incident light to the bottom cell.

Note that the silane-based gas is not limited to a gas using silane (so-called monosilane) and disilane ($Si_2H_6$) or the like may be used. Further, a rare gas may be added to the aforementioned source gas.

<Manufacture of Semiconductor Layer exhibiting Second Conductivity Type (Top Cell)>

Figure 9D:
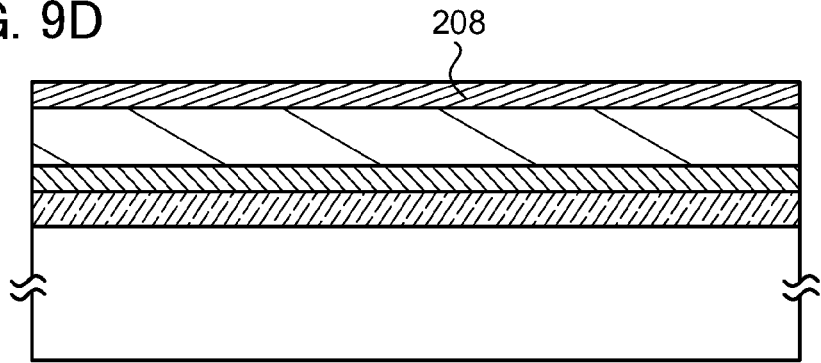

The semiconductor layer 208 exhibiting the second conductivity type is formed over the semiconductor layer 206 having an effect of photoelectric conversion (see FIG. 9D). For example, the semiconductor layer 208 exhibiting the second conductivity type can be formed using, for example, silicon to which phosphorus is added as an impurity element imparting a conductivity type. The aforementioned embodiment can be referred to for the detailed description of the material that can be used for the semiconductor layer 208 exhibiting the second conductivity type.

A method for forming the semiconductor layer 208 exhibiting the second conductivity type is the same as the method for forming the semiconductor layer 204 exhibiting the first conductivity type. For example, a silane-based gas is diluted with hydrogen and phosphine is added, so that the semiconductor layer 208 exhibiting the second conductivity type can be formed.

Note that in this embodiment, the conductivity type (the second conductivity type) of the semiconductor layer 208 exhibiting the second conductivity type is preferably n-type since a structure in which light enters from the bottom surface side of the substrate 100 (the lower side in the diagram) is employed. However, one embodiment of the disclosed invention is not limited thereto. In the case where the first conductivity type is n-type, the second conductivity type is p-type.

<Manufacture of Bottom Cell>

The semiconductor layer 104 exhibiting the first conductivity type, the semiconductor layer 106 having an effect of photoelectric conversion, and the semiconductor layer 108 exhibiting the second conductivity type, which are included in the bottom cell (the unit cell 150), are sequentially stacked. The aforementioned embodiment can be referred to for the detailed description of the methods for forming these layers. In the semiconductor layer 106 having an effect of photoelectric conversion, the crystal grains 112 which form a carrier path exist. Note that in this embodiment, the first conductivity type is p-type and the second conductivity type is n-type.

<Manufacture of Second Electrode>

Figure 10A:
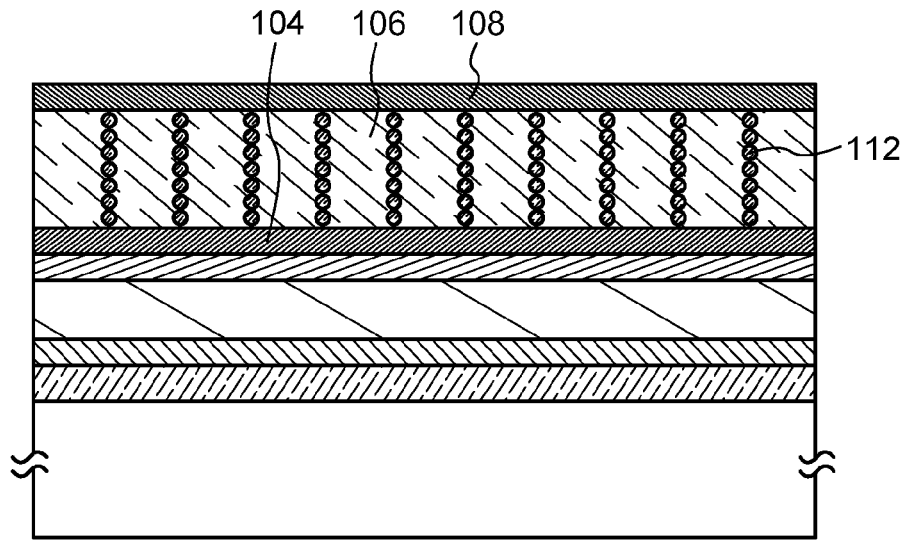
FIGS. 10A and 10B are cross-sectional views illustrating one example of a process for manufacturing a photoelectric conversion device.
Figure 10B:
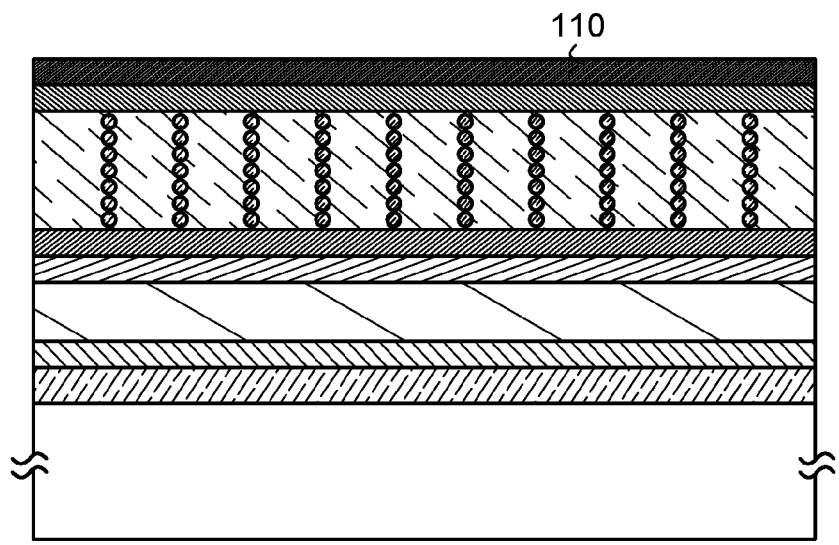

The second electrode 110 is formed over the semiconductor layer 108 exhibiting the second conductivity type included in the bottom cell (the unit cell 150) (see FIG. 10B). The aforementioned embodiment can be referred to for the detailed description of the step.

A photoelectric conversion device in which the semiconductor layer having an effect of photoelectric conversion, which includes crystal grains having a high conductivity, can be manufactured by the above-mentioned method. Note that a conductive layer having a light-transmitting property may be formed as an intermediate layer between the unit cell 150 and the unit cell 250. Further, a layer having another function may be formed.

Although the process for manufacturing a photoelectric conversion device in which two unit cells are stacked is described in this embodiment, a photoelectric conversion device in which three or more unit cells are stacked may be manufactured. In such a case, the crystal grains 112 which form a carrier path are formed in the semiconductor layer 106 having an effect of photoelectric conversion included in at least one unit cell.

This embodiment can be combined with any of the other embodiments as appropriate.

(Embodiment 6)

Figure 11A:
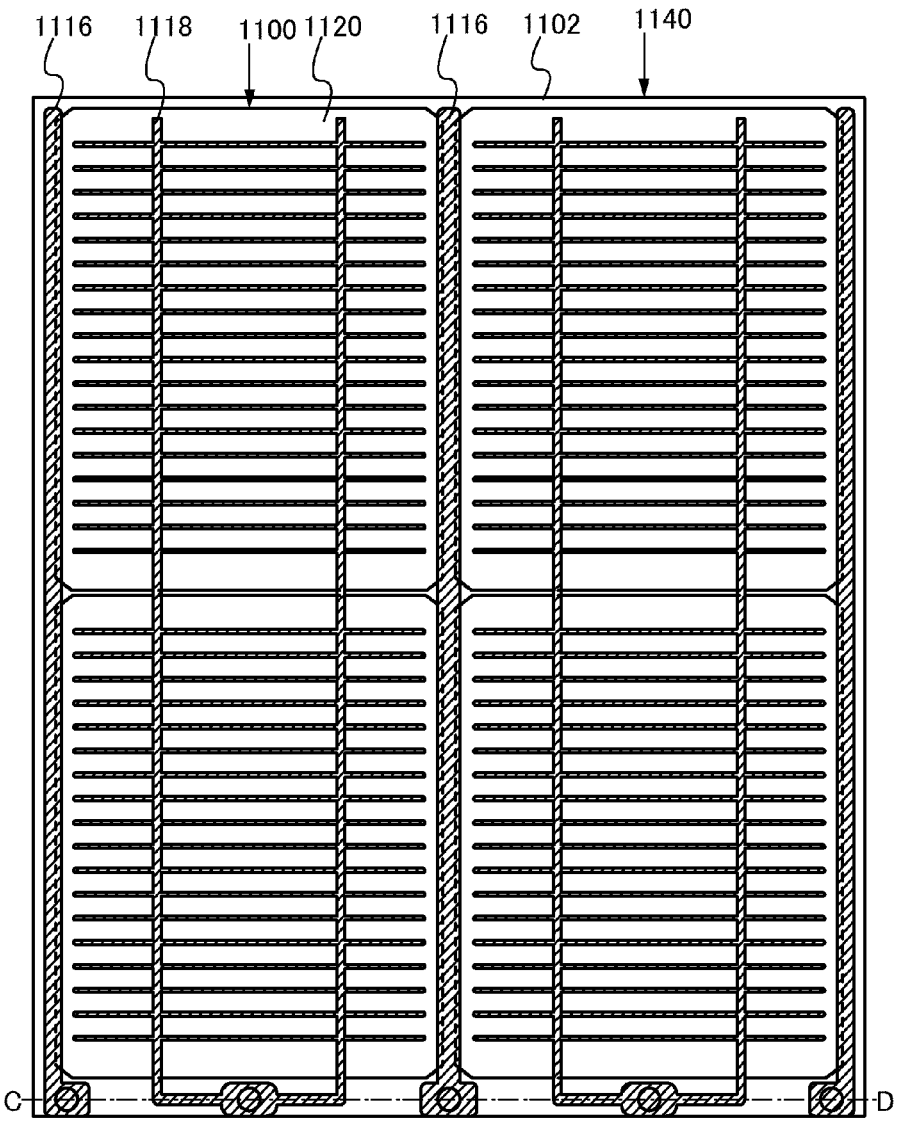
FIGS. 11A and 11B are conceptual diagrams illustrating a structure of a solar photovoltaic module.
Figure 11B:
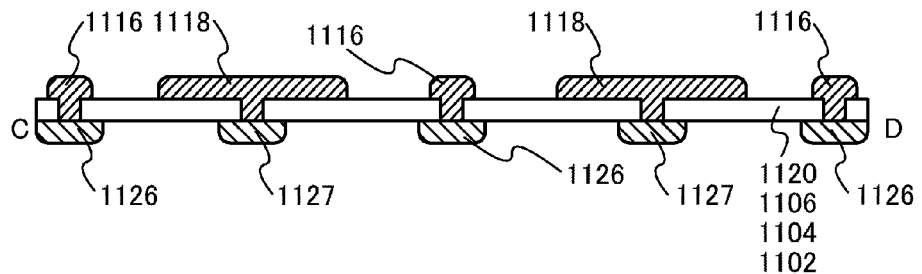

A solar photovoltaic module can be manufactured using the photoelectric conversion device described in the aforementioned embodiment. In this embodiment, an example of the solar photovoltaic module using the photoelectric conversion device is illustrated in FIGS. 11A and 11B. FIG. 11B is a cross-sectional view taken along line C-D in FIG. 11A.

A solar photovoltaic module 1140 includes a unit cell 1120 provided over a substrate 1102. Between the substrate 1102 and the unit cell 1120, an insulating layer 1104 and a first electrode 1106 are provided in this order from the substrate 1102 side. Further, the first electrode 1106 is connected to an auxiliary electrode 1116.

The auxiliary electrode 1116 and the second electrode 1118 are formed on one surface of the substrate 1102 (the side where the unit cell 1120 is formed). The auxiliary electrode 1116 and the second electrode 1118 are connected to a back electrode 1126 and a back electrode 1127 which are used for a connector, respectively, at end portions of the substrate 1102. In the solar photovoltaic module of this embodiment, the auxiliary electrode 1116 is connected to the back electrode 1126 and the second electrode 1118 is connected to the back electrode 1127 through openings of the substrate 1102.

This embodiment can be combined with any of the other embodiments as appropriate.

(Embodiment 7)

Figure 12:
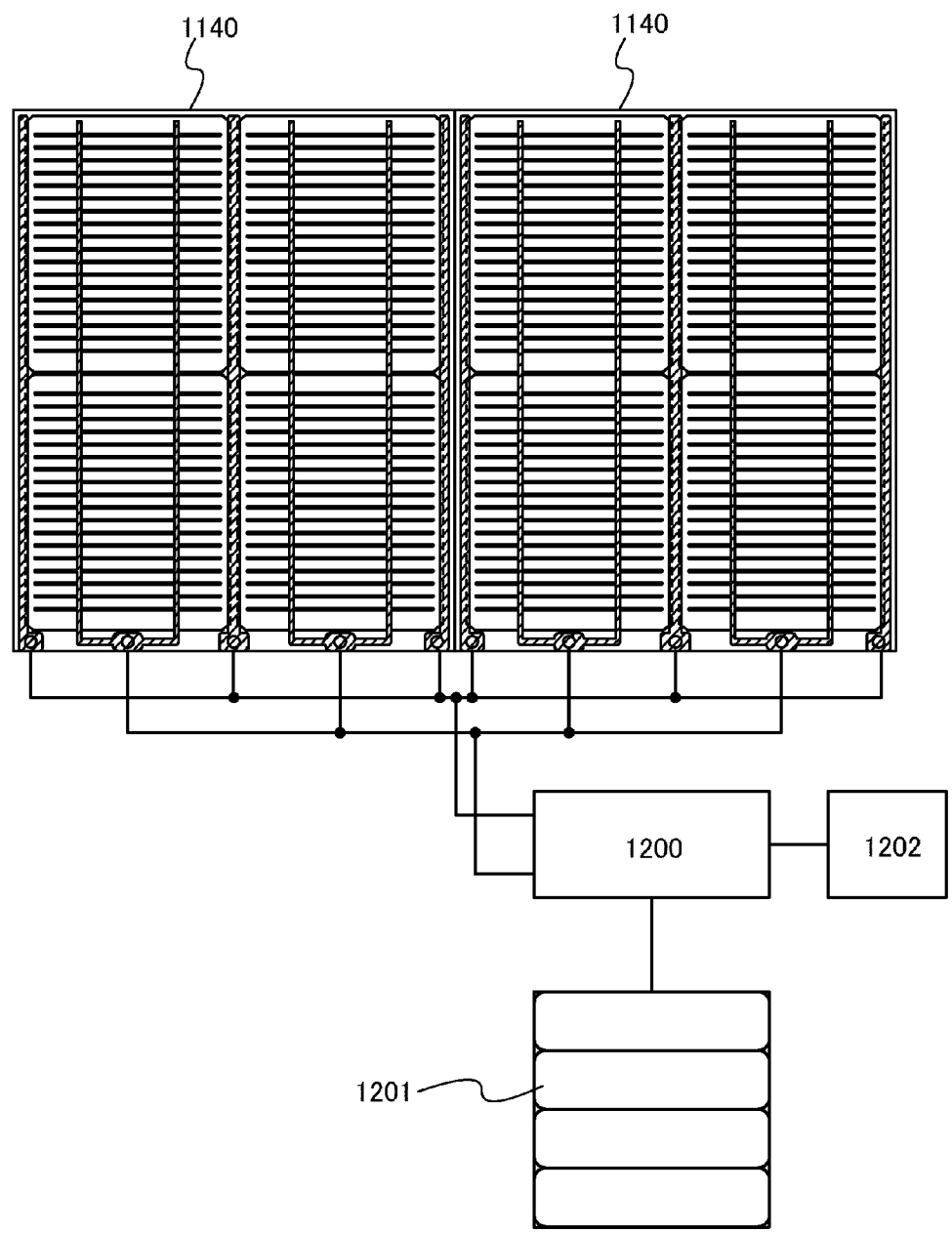
FIG. 12 is a conceptual diagram illustrating an example of a solar photovoltaic system.

FIG. 12 illustrates an example of a solar photovoltaic system using the solar photovoltaic module 1140 described in Embodiment 6. A storage battery 1201 is charged using power of a charge control circuit 1200, which is supplied from one or a plurality of solar photovoltaic modules 1140. Further, when the storage battery 1201 is sufficiently charged, the power supplied from the solar photovoltaic module 1140 is output directly to a load 1202.

When an electric double layer capacitor is used as the storage battery 1201, the storage battery 1201 can be charged rapidly because chemical reaction is not needed for the charging. Further, lifetime can be increased to about 8 times as long as and charging and discharging efficiency can be increased to about 1.5 times as high as those of a lead storage battery or the like which uses chemical reaction. The solar photovoltaic system described in this embodiment can be used for various types of loads 1202 which use electric power, such as lighting or an electronic device.

This embodiment can be combined with any of the other embodiments as appropriate.

(Embodiment 8)

The flow of carriers (a current) generated in a photoelectric conversion device was observed by computer calculation. The calculation results are described below with reference to FIGS. 13A and 13B and FIGS. 14A and 14B.

Figure 13A:
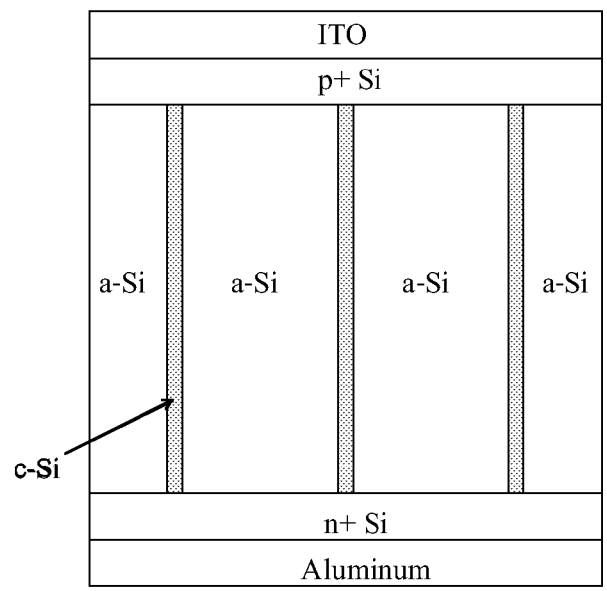
FIGS. 13A and 13B are model diagrams of a photoelectric conversion device used for computer calculation.
Figure 13B:
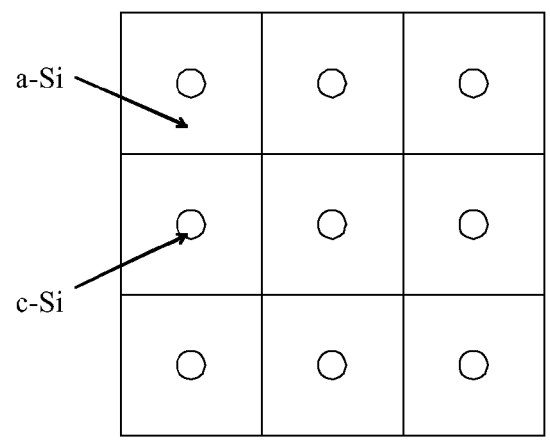

FIGS. 13A and 13B are model diagrams of a photoelectric conversion device used for the computer calculation in this embodiment. FIG. 13A is a cross-sectional view and FIG. 13B is a plan view of the photoelectric conversion device. Note that FIG. 13B illustrates a plan structure of a semiconductor layer having an effect of photoelectric conversion for simplicity.

The structure of the photoelectric conversion device used as a model (see FIGS. 13A and 13B) is similar to the structure of the photoelectric conversion device described in Embodiment 1. Specifically, the photoelectric conversion device used as a model has a structure in which an ITO electrode (thickness: 100 nm) corresponding to the first electrode, a p-type silicon layer (thickness: 100 nm) corresponding to the semiconductor layer exhibiting the first conductivity type, an amorphous silicon layer (thickness: 2 µm) corresponding to the semiconductor layer having an effect of photoelectric conversion, an n-type silicon layer (thickness: 100 nm) corresponding to the semiconductor layer exhibiting the second conductivity type, and an aluminum electrode (thickness: 100 nm) corresponding to the second electrode are stacked. Light for generating the carriers enters from the ITO electrode side of the photoelectric conversion device.

In this case, the calculation was performed assuming that the carrier path in which the crystal grains are linearly arranged in the aforementioned embodiment is cylindrical single crystal silicon which exists continuously from a p-type semiconductor layer to an n-type semiconductor layer. The radius of a circle of the base of the cylinder was set to 5 nm The interval between the cylinders was set to 200 nm. Note that one square region in FIG. 13B corresponds to one unit in the calculation. The calculation was performed using a device simulator produced by Silvaco Data Systems Inc.

Figure 14A:
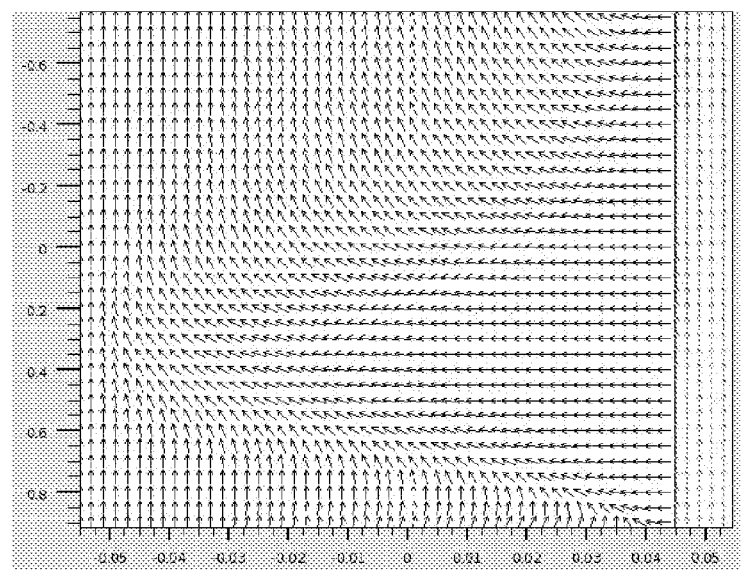
FIGS. 14A and 14B are each diagrams illustrating flow of carriers.

FIG. 14A illustrates a state of a current due to the flow of electrons. Arrows denote the flow of the current due to the electrons in FIG. 14A. That is, the electrons flow in the direction opposite to the direction indicated by the arrows.

Figure 14B:
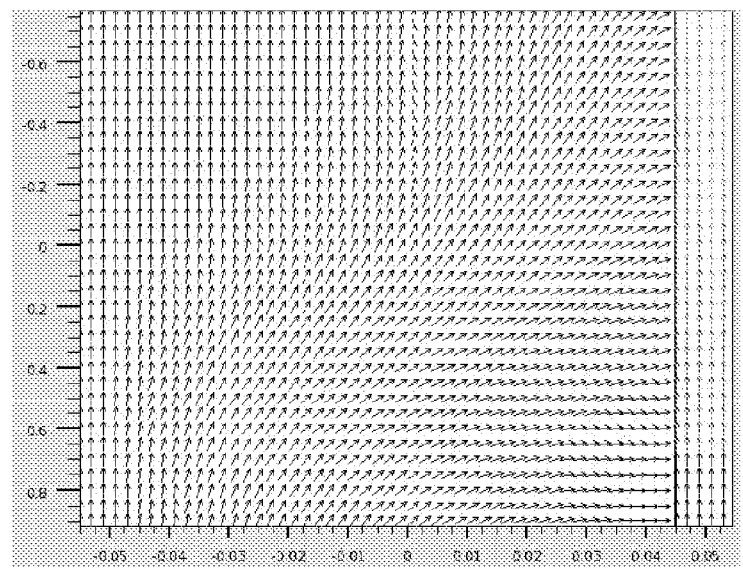

FIG. 14B illustrates a state of a current due to the flow of holes. Arrows denote the flow of the current due to the holes in FIG. 14B. Note that FIGS. 14A and 14B each illustrate a region corresponding to the cross-section of the semiconductor layer having an effect of photoelectric conversion. In FIGS. 14A and 14B, the left side corresponds to the amorphous silicon and the right side corresponds to cylindrical single crystal silicon. The interface between the amorphous silicon and the single crystal silicon exists in the range of 0.04 µm to 0.05 µm in a scale of a horizontal axis.

As seen from FIGS. 14A and 14B, carriers generated in the vicinity of the cylindrical single crystal silicon flow from the amorphous silicon into the cylindrical single crystal silicon. Since the single silicon has resistance lower than the amorphous silicon, in the case where a carrier path is formed, current loss can be reduced as compared with the case where a carrier path is not formed. Parameters of open voltage, a short-circuit current, fill factor, and the like can be slightly improved by the photoelectric conversion function of the single crystal silicon.

From the results of the computer calculation in this embodiment, it was confirmed that carriers generated in the amorphous silicon layer flow into a cylindrical carrier path which is formed of single crystal silicon. Note that although a cylindrical carrier path is assumed in this embodiment in order to simplify the calculation, the same can be applied to the case where a carrier path is formed of crystal grains.

This application is based on Japanese Patent Application serial no. 2009-184794 filed with Japan Patent Office on Aug. 7, 2009, the entire contents of which are hereby incorporated by reference.

What is claimed is:

1. A photoelectric conversion device, comprising:
a first electrode;
a unit cell comprising a semiconductor layer exhibiting a first conductivity type, a semiconductor layer having an effect of photoelectric conversion, and a semiconductor layer exhibiting a second conductivity type; and
a second electrode,
wherein the semiconductor layer having the effect of photoelectric conversion includes crystal grains,
wherein the crystal grains are aligned continuously one directly on top of another in a thickness direction of the semiconductor layer having the effect of photoelectric conversion, and
wherein the crystal grains are linearly aligned along a plurality of lines in the thickness direction of the semiconductor layer having the effect of photoelectric conversion and a distance between each of the plurality of lines is 50 nm to 1 µm.

2. The photoelectric conversion device according to claim 1, wherein the unit cell is interposed between the first electrode and the second electrode.

3. The photoelectric conversion device according to claim 1, wherein each grain diameter of the crystal grains is smaller than a thickness of the semiconductor layer having the effect of photoelectric conversion.

4. The photoelectric conversion device according to claim 1, comprising a plurality of regions in which the crystal grains are aligned.

5. The photoelectric conversion device according to claim 1, wherein regions in which the crystal grains are aligned are localized.

6. The photoelectric conversion device according to claim 1, wherein a base of the semiconductor layer having the effect of photoelectric conversion is an amorphous semiconductor.

7. The photoelectric conversion device according to claim 1, wherein a texture structure is provided for a surface of the first electrode.

8. The photoelectric conversion device according to claim 1, wherein a texture structure is provided for a surface of the semiconductor layer having the effect of photoelectric conversion.

9. The photoelectric conversion device according to claim 1, wherein each of the crystal grains has a size less than or equal to 20 nm.

10. A photoelectric conversion device, comprising:
a first electrode;
a plurality of unit cells each including a semiconductor layer exhibiting a first conductivity type, a semiconductor layer having an effect of photoelectric conversion, and a semiconductor layer exhibiting a second conductivity type; and
a second electrode,
wherein in at least one of the plurality of unit cells, the semiconductor layer having the effect of photoelectric conversion includes crystal grains,
wherein in at least one of the plurality of unit cells, the crystal grains are aligned continuously one directly on top of another in a thickness direction of the semiconductor layer having the effect of photoelectric conversion, and
wherein the crystal grains are linearly arranged along a plurality of lines in the thickness direction of the semiconductor layer having the effect of photoelectric conversion and a distance between each of the plurality of lines if 50 nm to 1 µm.

11. The photoelectric conversion device according to claim 10, wherein the plurality of unit cells are interposed between the first electrode and the second electrode.

12. The photoelectric conversion device according to claim 10, wherein each grain diameter of the crystal grains is smaller than a thickness of the semiconductor layer having the effect of photoelectric conversion.

13. The photoelectric conversion device, according to claim 10, comprising a plurality of regions in which the crystal grains are aligned.

14. The photoelectric conversion device according to claim 10, wherein regions in which the crystal grains are aligned are localized.

15. The photoelectric conversion device according to claim 10, wherein a base of the semiconductor layer having the effect of photoelectric conversion including the crystal grains is an amorphous semiconductor.

16. The photoelectric conversion device according to claim 10, wherein a texture structure is provided for a surface of the first electrode.

17. The photoelectric conversion device according to claim 10, wherein a texture structure is provided for a surface of the semiconductor layer having the effect of photoelectric conversion.

18. The photoelectric conversion device according to claim 10, wherein each of the crystal grains has a size less than or equal to 20 nm.

19. A photoelectric conversion device, comprising:
a first electrode;
a unit cell comprising a semiconductor layer exhibiting a first conductivity type, a semiconductor layer having an effect of photoelectric conversion, and a semiconductor layer exhibiting a second conductivity type; and
a second electrode,
wherein the semiconductor layer having the effect of photoelectric conversion includes crystal grains,
wherein the crystal grains are aligned one directly on top of another and configured to form a carrier path in a thickness direction of the semiconductor layer having the effect of photoelectric conversion, and
wherein the crystal grains are linearly arranged along a plurality of lines in the thickness direction of the semiconductor layer having the effect of photoelectric conversion and a distance between each of the plurality of lines is 50 nm to 1 μm.

20. The photoelectric conversion device according to claim 19, wherein the unit cell is interposed between the first electrode and the second electrode.

21. The photoelectric conversion device according to claim 19, wherein each grain diameter of the crystal grains is smaller than a thickness of the semiconductor layer having the effect of photoelectric conversion.

22. The photoelectric conversion device according to claim 19, comprising a plurality of regions in which the crystal grains are aligned.

23. The photoelectric conversion device according to claim 19, wherein regions in which the crystal grains are aligned are localized.

24. The photoelectric conversion device according to claim 19, wherein a base of the semiconductor layer having the effect of photoelectric conversion is an amorphous semiconductor.

25. The photoelectric conversion device according to claim 19, wherein a texture structure is provided for a surface of the first electrode.

26. The photoelectric conversion device according to claim 19, wherein a texture structure is provided for a surface of the semiconductor layer having the effect of photoelectric conversion.

27. The photoelectric conversion device according to claim 19, wherein each of the crystal grains has a size less than or equal to 20 nm.

28. A photoelectric conversion device, comprising:
a first electrode;
a plurality of unit cells each including a semiconductor layer exhibiting a first conductivity type, a semiconductor layer having an effect of photoelectric conversion, and a semiconductor layer exhibiting a second conductivity type; and
a second electrode,
wherein in at least one of the plurality of unit cells, the semiconductor layer having the effect of photoelectric conversion includes crystal grains,
wherein in the at least one of the plurality of unit cells, the crystal grains are aligned one directly on top of another and configured to form a carrier path in a thickness direction of the semiconductor layer having the effect of photoelectric conversion, and
wherein the crystal grains are linearly arranged along a plurality of lines in the thickness direction of the semiconductor layer having the effect of photoelectric conversion and a distance between each of the plurality of lines is 50 nm to 1 μm.

29. The photoelectric conversion device according to claim 28, wherein the plurality of unit cells are interposed between the first electrode and the second electrode.

30. The photoelectric conversion device according to claim 28, wherein each grain diameter of the crystal grains is smaller than a thickness of the semiconductor layer having the effect of photoelectric conversion.

31. The photoelectric conversion device according to claim 28, comprising a plurality of regions in which the crystal grains are aligned.

32. The photoelectric conversion device according to claim 28, wherein regions in which the crystal grains are aligned are localized.

33. The photoelectric conversion device according to claim 28, wherein a base of the semiconductor layer having the effect of photoelectric conversion including the crystal grains is an amorphous semiconductor.

34. The photoelectric conversion device according to claim 28, wherein a texture structure is provided for a surface of the first electrode.

35. The photoelectric conversion device according to claim 28, wherein a texture structure is provided for a surface of the semiconductor layer having the effect of photoelectric conversion.

36. The photoelectric conversion device according to claim 28, wherein each of the crystal grains has a size less than or equal to 20 nm.

\* \* \* \* \*

UNITED STATES PATENT AND TRADEMARK OFFICE
CERTIFICATE OF CORRECTION

PATENT NO.           : 8,772,627 B2
APPLICATION NO.      : 12/848357
DATED                : July 8, 2014
INVENTOR(S)          : Shunpei Yamazaki et al.

Page 1 of 1

It is certified that error appears in the above-identified patent and that said Letters Patent is hereby corrected as shown below:

In the Specification

Column 21, line 3, "nm" should be --nm.--;

In the Claims

Claim 1, column 21, line 58, "aligned" should be --arranged--;

Claim 10, column 22, line 44, "if" should be --is--;

Claim 13, column 22, line 52, "device," should be --device--.

Signed and Sealed this
Thirteenth Day of January, 2015

Michelle K. Lee
*Deputy Director of the United States Patent and Trademark Office*